United States Patent
Ito

(10) Patent No.: US 7,338,223 B2
(45) Date of Patent: Mar. 4, 2008

(54) DEVELOPING METHOD AND APPARATUS FOR PERFORMING DEVELOPMENT PROCESSING PROPERLY AND A SOLUTION PROCESSING METHOD ENABLING ENHANCED UNIFORMITY IN THE PROCESSING

(76) Inventor: Yoshitake Ito, 12-24, Higashi-Ishioka 3-Chome, Ishioka-shi (JP) 315-0037

( * ) Notice: Subject to any disclaimer, the term of this patent is extended or adjusted under 35 U.S.C. 154(b) by 79 days.

(21) Appl. No.: 11/337,643

(22) Filed: Jan. 24, 2006

(65) Prior Publication Data

US 2006/0120717 A1 Jun. 8, 2006

Related U.S. Application Data

(63) Continuation of application No. 10/622,796, filed on Jul. 21, 2003, now Pat. No. 7,077,585.

(30) Foreign Application Priority Data

Jul. 22, 2002 (JP) ............... 2002-244352

(51) Int. Cl.
*G03B 5/00* (2006.01)
(52) U.S. Cl. ........................ 396/611; 355/27
(58) Field of Classification Search ........... 355/611, 355/627; 396/611
See application file for complete search history.

(56) References Cited

U.S. PATENT DOCUMENTS

| 6,264,381 B1 | 7/2001 | Ueda ............ 396/611 |
| 6,715,943 B2 * | 4/2004 | Nagamine ........ 396/611 |
| 2002/0053319 A1 | 5/2002 | Nagamine ........ 396/611 |

FOREIGN PATENT DOCUMENTS

| JP | H01-241840 | 9/1989 |
| JP | H11-003852 | 1/1999 |
| JP | 2001-023892 | 1/2001 |
| JP | 2001-118790 | 4/2001 |
| JP | 2002-151376 | 5/2002 |

* cited by examiner

*Primary Examiner*—D. Rutledge
(74) *Attorney, Agent, or Firm*—Manabu Kanesaka

(57) ABSTRACT

A substrate processing apparatus and method provide for exhausting air from a first peripheral region α around a substrate undergoing processing, and for exhausting air from a second peripheral region β between the first peripheral region and the substrate. The method reduces the effects of air flow on a developing solution on the substrate, and enables the developing solution to act effectively on the exposed resist on the substrate.

15 Claims, 14 Drawing Sheets

DEVELOPING METHOD AND APPARATUS FOR PERFORMING DEVELOPMENT PROCESSING PROPERLY AND A SOLUTION PROCESSING METHOD ENABLING ENHANCED UNIFORMITY IN THE PROCESSING

This application is a continuation of U.S. application Ser. No. 10/622,796 filed Jul. 21, 2003, the subject matter of which is incorporated by reference herein.

BACKGROUND OF THE INVENTION

1. Field of the Invention

The present invention relates to a developing method and apparatus that supply a developing solution to a surface of a substrate, for example, on which a resist is coated and subjected to exposure, to perform development processing and a solution processing method enabling enhanced uniformity in the processing.

2. Description of the Related Art

It is generally known to use techniques of photolithography using photoresist in forming electronic materials such as substrates, for example, semiconductor wafers. An example of the techniques is disclosed in Japanese Laid-Open Patent Publication No. H02-296316.

The technique discloses a paddle development scheme as development processing. During the progress of development on a substrate, instead of holding the substrate on a rotating stage movable upwardly and downwardly, the substrate is supported by a ring supporting frame. The ring supporting frame is configured to enable the substrate to be provided and received to/from the rotating stage, and is provided with a rubber ring coming into contact with a back of the substrate, and development is performed in a cover.

Further, another example of the techniques is disclosed in Japanese Patent No. 3257038.

In this technique, during the progress of development on a substrate, instead of holding the substrate on a rotating stage, the substrate is supported by an isolating member. The isolating member is configured to enable the substrate to be provided to and received from the rotating stage, and to move upwardly and downwardly. The isolating member is provided with a pin coming into point-contact with a back of the substrate, and development is performed in a cup under downflow with controlled temperature and moisture.

SUMMARY OF THE INVENTION

Since the substrate is placed near an inject opening of the downflow with controlled temperature and moisture after supplying a developing solution to the substrate, there is a possibility that the developing solution on the substrate may spill as a result of the increased effect of the downflow, resulting in a decrease in the yield in the development processing.

Further, since the developing solution is supplied to a substrate in a cup to continue the development while exhausting the downflow with controlled temperature and moisture from the cup, the downflow has a significant effect on the developing solution on the substrate. There is, therefore, a chance that the developing solution on the substrate may spill as a result of the increased effect of the downflow, resulting in decreasing the yield in the development processing.

Furthermore, after separating the substrate from the rotating stage by the isolating member or ring supporting frame with the rubber ring, or in mounting the substrate on the rotating stage, mists of the developing solution and/or rinsing solution reach the back of the substrate, and adhere to the isolation member, ring supporting frame with the rubber ring, and/or the rotating stage. Then, the mists are generated in the processing chamber when the solution(s) dries, or the solutions adhered to the back of the substrate become mists in a subsequent processing chamber or during carriage of the substrate, and thus the whole processing apparatus is polluted. This results in decreasing not only the yield in the development processing, but also the yield in the entire substrate processing.

An object of the present invention is to provide a developing method and apparatus for performing development processing properly, and a solution processing method enabling enhanced uniformity in the processing.

In order to achieve the object, a first aspect of the present invention is a method of developing an exposed resist on a processing surface of a substrate in a cup, where the method has the steps of supporting or holding a side opposed to the processing substrate of the substrate and supplying a developing solution to the processing surface of the substrate and the cup, or to the processing surface of the substrate, exhausting air from a first peripheral region outside the cup during the progress of substantial development processing with the side opposed to the processing surface of the substrate held, and exhausting air from a second peripheral region inside the cup or from the second peripheral region and the first peripheral region in a rinsing process with the substrate held in vacuum attachment.

A second aspect of the present invention is an apparatus that develops an exposed resist on a processing surface of a substrate, where the apparatus has a first enclosing member disposed around the substrate, a second enclosing member disposed around the first enclosing member, a supporting mechanism that is disposed inside the first enclosing member and supports the substrate, a holding mechanism that is disposed inside the first enclosing member and holds the substrate in vacuum attachment, and an exhausting mechanism that exhausts air from a region between the first enclosing member and the second enclosing member when the substrate is supported by the supporting mechanism.

A third aspect of the present invention is a method of supplying a processing solution to a substrate to process, where the method has the steps of exhausting air from a first peripheral region around the substrate, and exhausting air from a second peripheral region between the first peripheral region and the substrate and from the first peripheral region, or from the second peripheral region.

The present invention allows exhaust primarily from the first peripheral region around the substrate undergoing processing, and further from the second peripheral region between the first peripheral region and the substrate. Therefore, the present invention enables reduced effects of currents of air on a processing solution, for example, developing solution on a processing surface of the substrate, further enables the developing solution used in development to properly act on the exposed resist on the substrate, and thus enhances the uniformity in the processing on the substrate and improves the yield in the processing on the substrate.

The above and further objects and features of the present invention will be more fully apparent from the following detailed description with the accompanying drawings.

DETAILED DESCRIPTION OF THE PREFERRED EMBODIMENTS

Embodiments of the present invention will be described below specifically with reference to the accompanying drawings.

Figure 1:
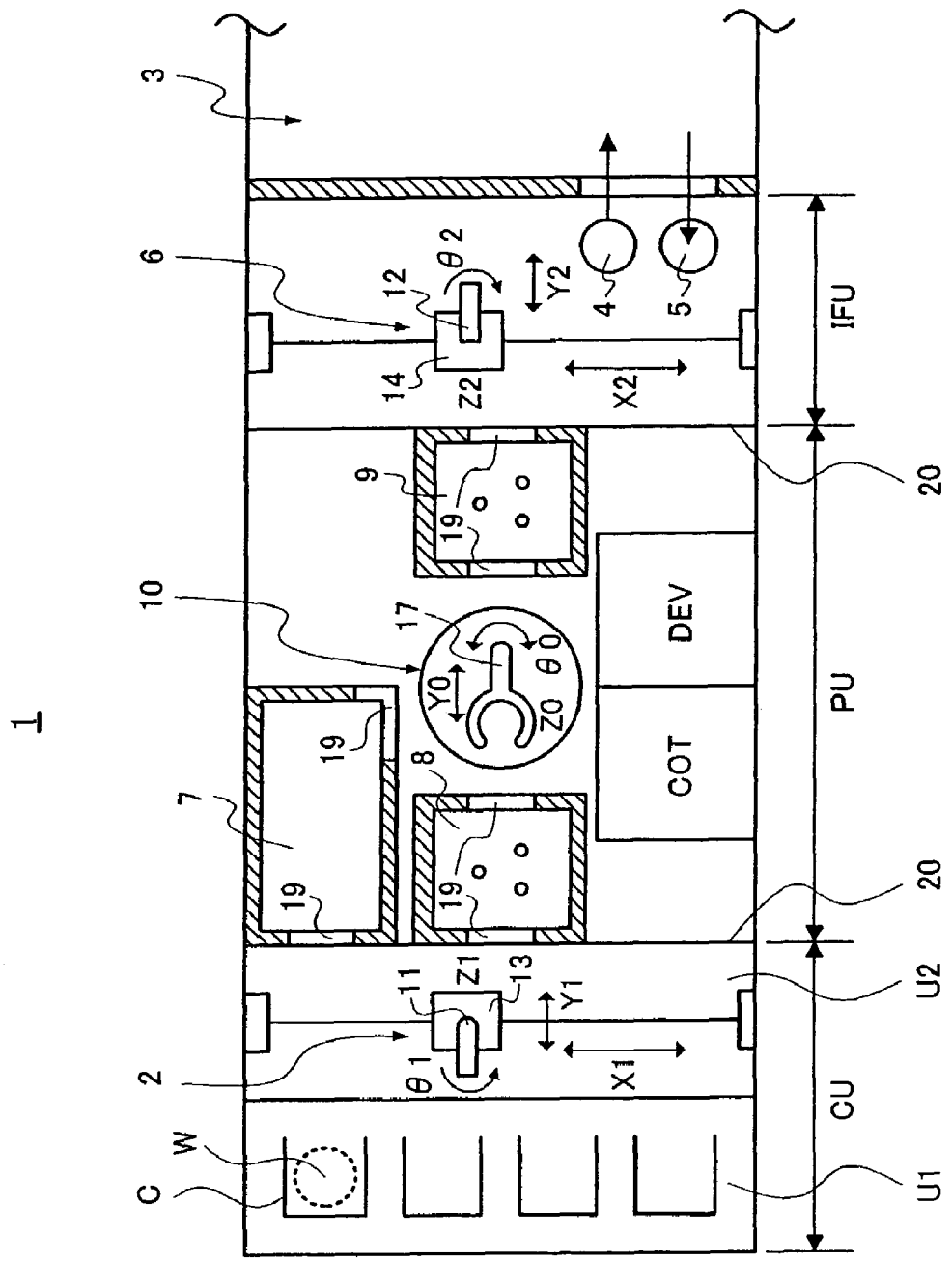
FIG. 1 is a plan view showing an entire structure of a coating/developing apparatus according to one embodiment of the present invention.

FIG. 1 is a schematic plan view showing an entire structure of a coating/developing apparatus as a solution processing apparatus, for example, resist processing apparatus according to one embodiment of the invention.

A resist processing apparatus 1 has in its primary portion a cassette unit section CU having a cassette mount section U1 enabling itself to mount a plurality of cassettes C thereon where each cassette enables itself to store a plurality of substrates, for example, semiconductor wafers W, and a substrate carrying in/out mechanism section U2 having a substrate carrying in/out mechanism 2 enabling each semiconductor wafer W to be carried in or out of a cassette C in the cassette mount section U1 on a sheet basis. An interface unit IFU section has a providing section 4 that provides each semiconductor wafer W on a sheet basis to another apparatus, for example, an exposure apparatus 3 that performs exposure processing on the semiconductor wafer W, a receiving section 5 that receives each semiconductor wafer W on a sheet basis from the exposure apparatus 3, and a substrate carrying in/out mechanism 6 enabling each semiconductor wafer W to be carried in or out on a sheet basis. A process unit section PU has processing sections that perform predetermined processing on the semiconductor wafer W, for example, as solution processing section, a coating processing section COT that coats a resist solution, a development processing section DEV that develops the exposed resist on the semiconductor wafer W, a check processing section 7 that checks a state of the resist film on the semiconductor wafer W at predetermined timing for the semiconductor wafer W, substrate providing/receiving sections 8 and 9 enabling each semiconductor wafer W to be carried in or out of the substrate carrying in/out mechanisms 2 and 6 on a sheet basis, respectively, and a substrate carrying mechanism 10 enabling each semiconductor wafer W to be provided on a sheet basis to the substrate providing/receiving sections 8 and 9, coating processing section COT, development processing section DEV and check processing section 7.

In addition, arms 11 and 12 in the substrate carrying in/out mechanisms 2 and 6 which hold the semiconductor wafers W in vacuum attachment or support periphery portions of semiconductor wafers W in point-contact or in line-contact are movable in vertical directions Z1 and Z2, in the forward/backward directions Y1 and Y2 and in rotation directions θ1 and θ2, as viewed in the figure, and bases 13 and 14 of the arms 11 and 12 are movable in the horizontal directions X1 and X2 as viewed in the figure together with the arms 11 and 12, respectively. An arm 17 of the substrate carrying mechanism 10 in the process unit section PU holds the periphery portion of a semiconductor wafer W in point-contact or in line-contact, and is movable in the vertical direction Z0, in the forward/backward direction Y0 and in the rotation direction θ0 as viewed in the figure. In addition, for convenience, the substrate carrying in/out mechanisms 2 and 6 and substrate carrying mechanism 10 are configured as described above. However, an articulated robot can be used, and it is only necessary to provide the substrate carrying in/out mechanism section U2 and interface unit section IFU with carrying mechanisms capable of implementing the above-mentioned functions.

At a position below each of the substrate providing/receiving sections 8 and 9 is provided a plurality of temperature adjusting sections (not shown) that is laminated and adjusts the temperature of the semiconductor wafer W to approximately the same temperature as that inside the processing chamber. Further, at a position below the plurality of temperature adjusting sections is provided a plurality of gas processing sections (not shown) that is laminated and executes processing on the semiconductor wafer W using processing gas such as, for example, HMD gas. At a position above each of the substrate providing/receiving sections 8 and 9 is provided a plurality of heating processing sections (not shown) that is laminated and heats the semiconductor wafer W to the predetermined temperature more than room temperature to execute processing.

Each of the substrate carrying mechanisms 10 in the process unit section PU and the substrate carrying in/out mechanism 2 in the cassette unit section CU is capable of carrying the semiconductor wafer W in and out of the check processing section 7 in the process unit section PU. Therefore, it is possible to perform a check such as, for example, a thickness of the resist film on the semiconductor wafer W prior to the processing, and the semiconductor wafer W after the processing in each of the above-mentioned processing sections and/or exposure apparatus.

At a position above each of the substrate carrying in/out mechanism sections U2 in the cassette unit section CU, the process unit section PU and the interface unit section IFU are provided with a filter section (not shown), and the filter section supplies air with temperature and moisture respectively set at a predetermined value to a respective unit. Further, an exhaust opening provided under each of the unit sections recovers the air with temperature and moisture set at a predetermined amount by a respective exhaust setting mechanism so as to enable downflow of the air with the predetermined temperature and moisture to be formed in each unit section.

Respective exhaust setting mechanisms of the substrate carrying in/out mechanism section U2 in the cassette unit section CU, the process unit section PU and the interface unit section IFU set pressures such that the pressure inside the process unit section PU is higher than that inside the substrate carrying in/out mechanism section U2 in the cassette unit section CU, that the pressure inside the process unit section PU is higher than that inside the interface unit section IFU, and that the pressure inside the exposure apparatus 3 is higher than that inside the interface unit section IFU. This prevents unnecessary mists, which could have adverse effects on the processing on the semiconductor wafer W, from entering the process unit section PU and/or exposure apparatus 3. As compared to oxygen and/or acidic gases (such as NOX, SOX, $H_2S$, and $CO_2$) and/or basic gases (such as ammonia and amine) and/or moisture contained in the atmosphere inside cassette unit section CU, their amounts contained in the atmosphere inside the process unit section PU and/or interface unit section IFU are set to be substantially smaller. This is to prevent the reducing effects thereof on the processing, particularly prior to or subsequent to exposure, and thus improving the yield of the processing of the semiconductor wafer W.

In addition, as described above, walls 20 are provided between the substrate carrying in/out mechanism section U2 in the cassette unit section CU and the process unit section PU, and between the process unit section PU and the interface unit section IFU, to interrupt (i.e., segregate) the atmospheres of the sections. Substrate in/out opening 19 of each of the substrate providing/receiving sections 8 and 9 and check processing section 7 is capable of being opened and closed by an opening/closing mechanism (not shown) for example, a cover, except during processes for carrying in and out the semiconductor wafer W. The substrate in/out openings 19 are thus configured to interrupt each of the atmospheres of the substrate carrying in/out mechanism section U2 in the cassette unit section CU, the process unit section PU, and the interface unit section IFU.

Coating processing sections COT in the process unit section PU are arranged as a plurality of laminates. Further, development-processing sections DEV are arranged as a plurality of laminates. With respect to these processing sections, the semiconductor wafer W can be carried in and out by the substrate carrying mechanism 10. In addition, temperatures and moistures inside the coating processing sections COT and/or development processing sections DEV are set at predetermined values, and set to be higher than those in the process unit section PU even when the exhaust conditions inside the processing sections change. This is to prevent mists from entering the coating processing sections COT and/or development processing sections DEV, which in solution-processing sections can be factors having adverse effects on the processing on the semiconductor wafer W. Further, the atmosphere inside the processing sections COT and/or development processing sections DEV is set to be smaller than the atmosphere inside the process unit section PU in amounts of oxygen and/or acidic gases (such as NOX, SOX, $H_2S$, and $CO_2$) and/or basic gases (such as ammonia and amine) and/or moisture contained in the atmosphere. This is to prevent the reducing effects of such gases, and thus improve the yield of the processing of the semiconductor wafer W.

A structure of the development processing section DEV will be described below with respect to FIGS. 2, 3A, 3B, 4A, 4B, 4C, and 4D.

The development processing section DEV is provided with at its upper portion an air supplying mechanism 30 that supplies the air with the temperature and moisture controlled to predetermined values to the processing chamber, and is configured to be maintained at a predetermined temperature and moisture based on detection data in a sensor 30*a* provided in the processing chamber by a control mechanism 31.

At a lower position of the processing chamber is provided a chuck 32 as a holding mechanism that holds the back of the semiconductor wafer W in vacuum attachment (i.e., by suction). The chuck 32 is configured to be rotatable by a rotation driving mechanism, for example, a motor 33. In addition, the chuck 32 is configured not to move upwardly and downwardly in this embodiment. Since the motor 33 needs to move upwardly and downwardly to cause the chuck 32 to move upwardly and downwardly, a range of thermal effects of the motor 33 on the apparatus becomes wider, and thus a risk arises that the semiconductor wafer W undergoes the thermal effects, and the yield decreases.

Further, to suppress the thermal effects, a large thermal suppressing mechanism located under the processing chamber would be required. For example, the vertical size of the processing chamber needs to be as thin as possible in order to arrange a plurality of such processing chambers to be laminated. However, in a system that does not require such a consideration, the chuck can be configured to move with the motor 33.

Figure 3A:
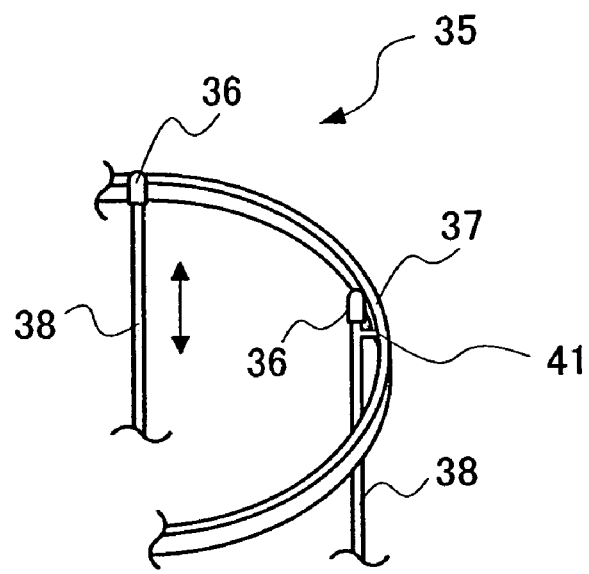
FIG. 3A is a schematic perspective view to explain a supporting mechanism of a primary portion of the development processing section (DEV) in FIG. 2.
Figure 3B:
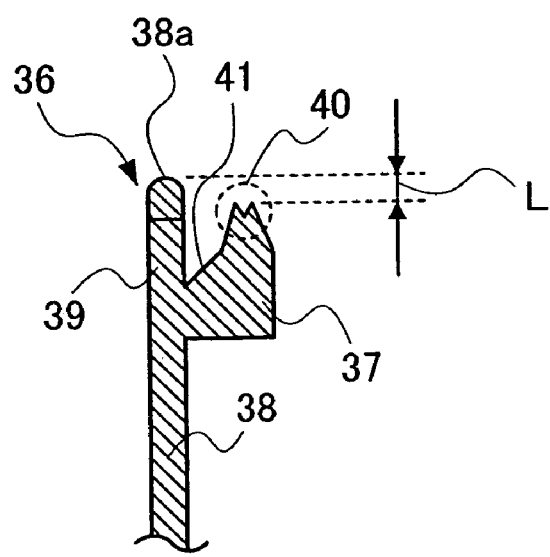
FIG. 3B is a schematic sectional view to explain the supporting mechanism of the primary portion of the development processing section (DEV) in FIG. 2.

At a position below the chuck 32 is provided a supporting mechanism 35 that supports the back of the semiconductor wafer W. As shown in FIGS. 3A and 3B, the supporting mechanism 35 is provided with a plurality of supporting pins 36 that supports the back of the semiconductor wafer W in point-contact, a ring member 37 as a solution penetration preventing mechanism that is provided outside the supporting pins 36 and prevents the processing solution such as the developing solution and rinsing solution from entering a center portion of the back of the semiconductor wafer W, and a plurality of supporting poles 38 that supports in one piece the ring member 37 and supporting pins 36.

Further, as shown in FIG. 3B, heights and positions of supporting pins 36 and ring member 37 are set so that supporting pins 36 are higher by a predetermined length, for example, a length to hold the processing solution between the back of the semiconductor wafer W and the ring member 37 by surface tension of the processing solution such as the developing solution and/or rinsing solution, e.g., a length of more than 0.5 mm to prevent the contact with the semiconductor wafer W, e.g., length (L in the figure) ranging from 1.5 mm to 5 mm. This is to prevent the ring member 37 from coming into direct contact with the back of the semiconductor.

A contact portion 38a of the supporting pin 36 to be in contact with the back of the semiconductor W is formed of, for example, an elastic member, as a member having a higher coefficient of friction and lower thermal conductivity than those of a member 39 forming the supporting pin 36, and also as a displacement preventing member that prevents occurrences of horizontal displacements including horizontal displacements in supporting the back of the semiconductor W, and further in supplying the processing solution to the semiconductor wafer after supporting the back of the semiconductor W. The low thermal conductivity reduce the possibility that the uniformity in the surface is undermined due to effects such as the heat escaping from the semiconductor wafer W through the contact portion with the supporting pin 36 during the processing of the semiconductor wafer W. As materials for the contact portion 38a, examples include engineering plastics such as PEEK.PBI, ceramics such as alumina. zirconium, and rubbers such as perfluorocompounds.

Further, the ring member 37 is provided with at its head portion an asperity portion 40 (solution penetration preventing portion) as a solution holding portion that holds the developing solution and/or rinsing solution supplied to the semiconductor wafer W between the member 37 and the back of the semiconductor wafer W by surface tension. On an inner wall of the asperity portion 40 is provided a tilting portion 41 to enable the solution to escape smoothly. In addition, for convenience, this embodiment describes the asperity portion 40 as a solution holding portion that holds the solution by surface tension. However, the solution-holding portion is not limited to the portion 40 as long as the portion has a mechanism that holds by surface tension.

Figure 2:
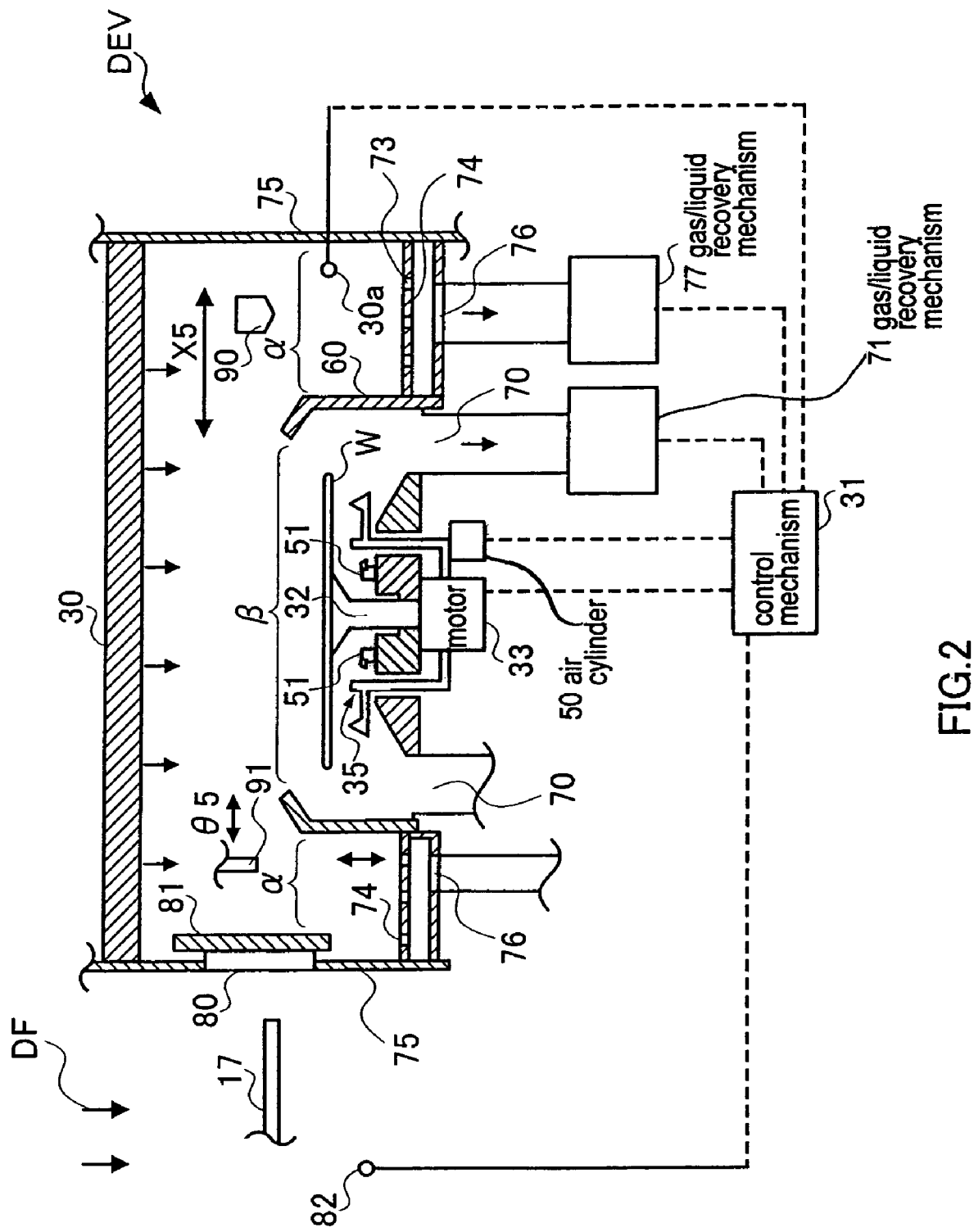
FIG. 2 is a schematic sectional view showing one embodiment of a development processing section (DEV) shown in FIG. 1.

As shown in FIG. 2, the supporting mechanism 35 is configured to be movable upwardly and downwardly by a moving mechanism, for example, an air cylinder 50 for the supporting mechanism.

Further as shown in FIG. 2, on an inner side of the supporting mechanism 35 is provided a plurality of back nozzles 51 as a rinsing solution back supply mechanism that supplies the rinsing solution, for example, pure water, to the periphery portion of the semiconductor wafer W on the back of the semiconductor wafer W or to the asperity portion 40 of the ring member 37.

Around the chuck 32 is provided a cup 60 as a first enclosing member configured to enclose the semiconductor wafer W held by the chuck 32. At a position below the cup 60 is provided a gas/liquid recovery opening 70 that recovers at least part of the air from the air supplying mechanism 30 and the developing solution and/or rinsing solution, and a gas/liquid recovery mechanism 71 as an exhaust mechanism that recovers such air and liquid. The gas/liquid recovery mechanism 71 is configured to be able to set a recovery amount of the air at an arbitrary predetermined amount. In other words, a region (second peripheral region β) to exhaust from inside the cup 60 is configured to enable an arbitrary predetermined amount to be set. In addition, the cup 60 is configured to be movable upwardly and downwardly by a cup moving mechanism (not shown).

Around the cup 60 is disposed a wall portion 75 that forms a wall of the processing chamber as a second enclosing member provided to enclose the cup 60. At a position below a region between the cup 60 and wall portion 75 is provided a gas/liquid recovery opening 76 that recovers at least part of the air from the air supplying mechanism 30 and the developing solution and/or rinsing solution through a rectifying mechanism 74 provided with a plurality of recovery openings 73 that rectifies the stream of air, and a gas/liquid recovery mechanism 77 as an exhaust mechanism that recovers such air and solution. The gas/liquid recovery mechanism 77 is configured to be able to set a recovery amount of the air at an arbitrary predetermined amount. In other words, a region (first peripheral region α) to exhaust from the region between the cup 60 and wall portion 70 is configured to enable an arbitrary predetermined amount to be set.

Moreover, as shown in FIG. 2, the wall portion 75 is provided with a carry-in/out opening 80 through which the arm 17 of the substrate carrying mechanism 10 that carries the semiconductor wafer W enters and exits the processing chamber, and is further provided with a cover 81 as an opening and closing mechanism that opens and closes the carry-in/out opening 80 to interrupt the atmosphere between the processing chamber and an arrangement space of the substrate carrying mechanism 10 where the downflow DF is formed. In, addition, with respect to the relationship between the pressure inside the processing chamber and the arrangement space of the substrate carrying mechanism 10, the pressure inside the processing chamber is set higher. This is to prevent, for example, particles from entering the processing chamber from the arrangement space of the substrate carrying mechanism 10.

Accordingly, based on detected data of a sensor 82 provided inside the arrangement space of the substrate carrying mechanism 10, the control mechanism 31 controls an air supply amount from the air supplying mechanism 30 and/or an air recovery amount from the gas/liquid recovery mechanism 77 and/or an air recovery amount from the gas/liquid recovery mechanism 71. When the arm 17 of the substrate carrying mechanism 10 enters the processing chamber, the cover 81 is opened and the pressure inside the processing chamber decreases. The change in pressure is detected by the sensor 82, and when the decreased pressure inside the processing chamber is higher than that inside the process unit section PU (i.e., even the pressure inside the processing chamber decreases temporarily), it is not necessary to substantially vary, as compared to a set value during the processing of the semiconductor wafer W, a factor of varying the pressure inside the processing chamber, e.g., at least one factor among factors of air supply amount from the air supplying mechanism 30, air recovery amount from the gas/liquid recovery mechanism 77, and air recovery amount from the gas/liquid recovery mechanism 71.

Further, when the cover 81 is opened and the pressure inside the processing chamber is approximately the same as the pressure inside the process unit section PU or is to be maintained in a predetermined pressure difference, it is preferable to, before opening the cover 81, instead of varying the air supply amount from the air supply mechanism 30, vary at least one factor among the factors of the air recovery amount from the gas/liquid recovery mechanism 77 and air recovery amount from the gas/liquid recovery mechanism 71. In other words, to respond, it is preferable to decrease the recovery amount or to stop the recovery. The reason is that when the factor of varying the pressure is varied, an amount of time is required to reach the value set during the processing of the semiconductor wafer W, and the throughput of the processing is reduced.

Figure 4A:
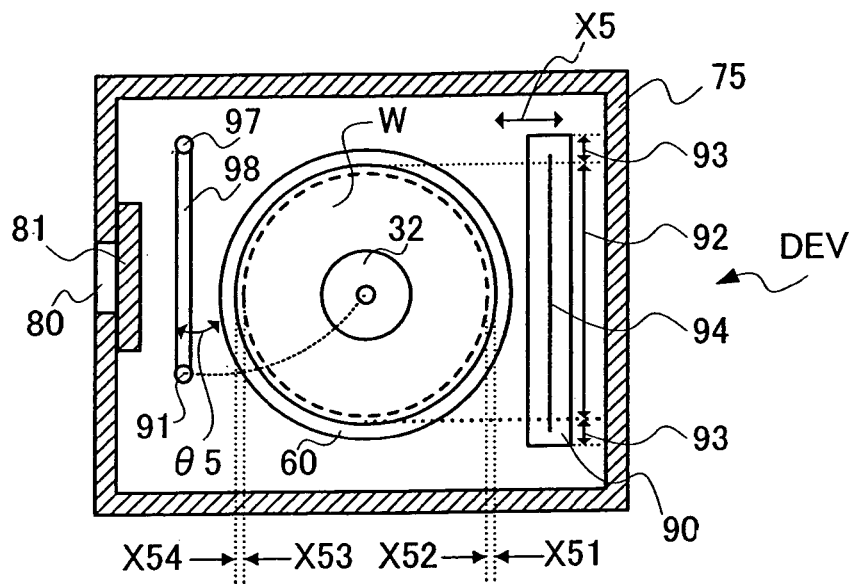
FIG. 4A is a schematic plan view to explain a development processing section (DEV) in FIG. 2.
Figure 4B:
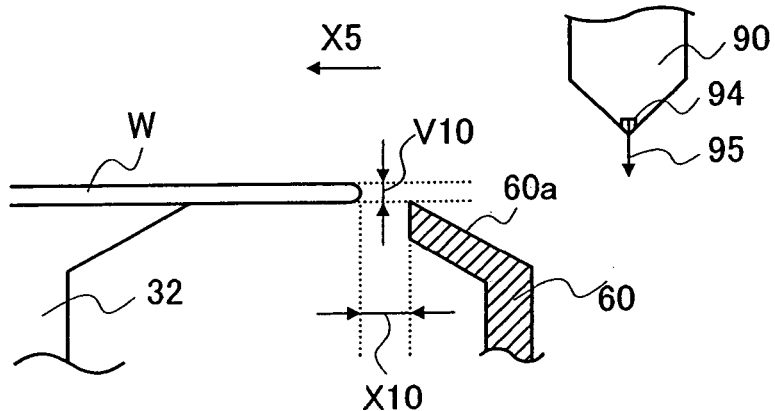
FIG. 4B is a schematic sectional view to explain the primary portion of the development processing section (DEV) in FIG. 2.

As shown in FIGS. 2, 4A and 4B, inside the processing chamber are provided a development nozzle 90 as a developing solution supplying mechanism that supplies the developing solution as a processing solution to the semiconductor wafer W, and a rinse nozzle 91 as a rinsing solution supplying mechanism that supplies a rinsing solution as a processing solution such as, for example, pure water and/or an aqueous solution obtained by adding a surfactant to pure water, to the semiconductor wafer W.

The development nozzle 90 is provided with, at a region larger by a predetermined length 93 than an inner diameter 92 of the cup 60, a discharging opening 94 that discharges the developing solution to the cup 60 and the semiconductor wafer W at the same time. Further, the development nozzle 90 is configured to be movable in the direction X5 in the figure by a moving mechanism (not shown), starts discharging at least X51 above the cup 60, while moving to a discharge end position that is at least an end side X53 of the semiconductor wafer W (preferably X54 on above the cup 60), and is configured to enable the developing solution to be filled on the semiconductor wafer W.

Figure 4C:
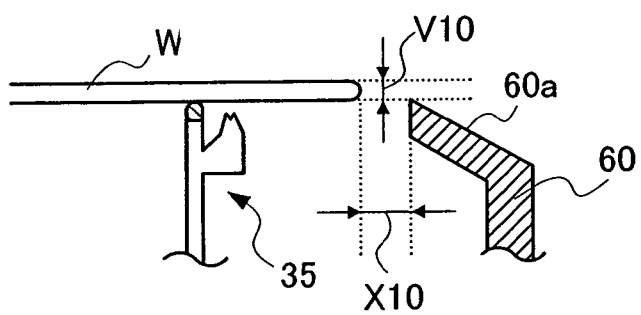
FIG. 4C is another schematic sectional view to explain the primary portion of the development processing section (DEV) in FIG. 2.

With respect to the positional relationship in filled solution between the cup 60 and chuck 32, as shown in FIGS. 4B and 4C, the developing solution 95 discharged by the development nozzle 90 from above the cup 60 moves horizontally in the direction X5 to proceed. With respect to the relationship in height between the cup 60 and the processing surface of the semiconductor wafer W held by chuck 32 or supported by the supporting mechanism 35, the processing surface of the semiconductor wafer W is set to be positioned at a position with the same height as that of cup 60 or at a position of height V10 higher than the cup 60, and is capable of being set in distance X10 between the cup 60 and the semiconductor wafer W held by the chuck 32 or supported by the supporting mechanism 35 due to relative movement between the cup 60 and/or the chuck 32 or supporting mechanism 35. It is preferable to set such distances, i.e., distances V10 and X10 between the semiconductor wafer W and cup 60, so that the developing solution is held but does not remain between the semiconductor wafer W and the cup 60 by surface tension of the developing solution discharged from the development nozzle 90. Excessively large distances V10 and X10 between the semiconductor wafer W and cup 60 cause the developing solution to be supplied only to the semiconductor wafer W, and are not preferable. In other words, it is preferable to set V10 and X10 at distances such that during the time the development nozzle 90 is moving in the direction X5, the developing solution discharged from the development nozzle 90 is temporarily held between the semiconductor wafer W and cup 60 by surface tension, but is not held anymore between the semiconductor wafer W and cup 60 by surface tension as the development nozzle 90 continues to move. In other words, distances are set such that the developing solution is temporarily held between the semiconductor wafer W and cup 60 by surface tension when the developing solution is supplied from the development nozzle 90, and that at a portion where the developing solution is not supplied as the development nozzle 90 continues to move on, the developing solution is pulled between the semiconductor wafer W and cup 60 by surface tension and cannot be held anymore between the semiconductor wafer W and cup 60. These distances are set as appropriate with the type of developing solution being employed. In this way, any excess developing solution slides down a tilting portion 60a, or falls into the cup 60 to be recovered, and an appropriate amount of developing solution is filled on the semiconductor wafer W.

Figure 4D:
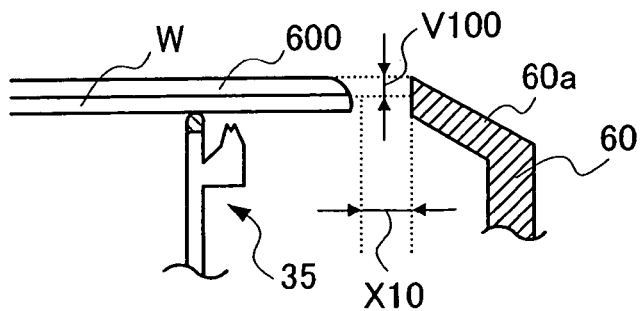
FIG. 4D is another schematic sectional view to explain the primary portion of the development processing section (DEV) in FIG. 2.

As another embodiment, as shown in FIG. 4D, the height of the cup 60 is set at distance V100 that is higher than approximately the same height as that of the semiconductor wafer W, for example, higher than height of the developing solution 600 filled on the semiconductor wafer W. It is also possible to set the height in this way to generate the above-mentioned effects. In addition, the same setting can be used in chuck 32. Further, since the height of the cup 60 is set at distance V100 that is higher than approximately the same height as that of the semiconductor wafer W, it is possible to prevent the effect of currents of air attributable to exhaust from outside the cup 60 from acting on the developing solution filled on the processing surface of semiconductor wafer W, and to thus improve the yield in the processing.

Moreover, as shown in FIGS. 2 and 4A, in the processing chamber is provided an arm 98 as an arm moving mechanism movable in the rotation direction θ5 on an axis portion 97 as a supporting point. On a front portion of the arm 98 is provided the rinse nozzle 91 that supplies to the semiconductor wafer W a rinsing solution as a processing solution, for example, pure water or pure water containing a predetermined amount of surfactant. Movement of the arm 98 enables the rinse nozzle 91 to supply the rinsing solution to the center portion and its vicinity of the processing surface of the semiconductor wafer W.

A structure of the coating processing section COT will be described with reference to FIG. 5.

The coating processing section COT is provided with, at its upper portion, an air supplying mechanism 100 that supplies the air with the temperature and moisture controlled to predetermined values to the processing chamber, and is configured to be maintained at predetermined temperature and moisture based on detection data in a sensor 101 provided in the processing chamber by the control mechanism 31.

At a lower position of the processing chamber is provided a chuck 102 as a holding mechanism that holds the back of the semiconductor wafer W in vacuum attachment. The chuck 102 is configured to be rotatable by a rotation driving mechanism, for example, a motor 103. In addition, the chuck 102 is configured not to move upwardly and downwardly in this embodiment. Since the motor 103 needs to move upwardly and downwardly to cause the chuck 102 to move upwardly and downwardly, a range of thermal effects of the motor 103 on the apparatus becomes wider, and thus the possibility arises that the semiconductor wafer W may undergo the thermal effects, and the yield decreases.

Further, to suppress the thermal effects, a large thermal suppressing mechanism located under the processing chamber may be required. For example, the vertical size of the processing chamber needs to be as thin as possible to arrange a plurality of such processing chambers to be laminated.

However, in a system that does not require such a consideration, the chuck can be configured to move with the motor 103.

At a position below the chuck 102 is provided a supporting mechanism 104 that supports the back of the semiconductor wafer W. The supporting mechanism 104 has a plurality of supporting pins 105 that supports the back of the semiconductor wafer W in point-contact, and is configured to be movable by a moving mechanism, for example, an air cylinder 106 that integrally moves the chuck and pins.

Further, on an inner side of the supporting mechanism 104 is provided a plurality of back nozzles 107 as a solvent liquid back supply mechanism that supplies a solvent liquid, for example, thinner liquid to the periphery portion of the processing surface of the semiconductor wafer W on the back of the semiconductor wafer W.

Around the chuck 102 is provided a cup 110 as a first enclosing member configured to enclose the semiconductor wafer W held by the chuck 102. At a position below the cup is provided a gas/liquid recovery opening 111 that recovers at least part of the air from the air supplying mechanism 100 and the coating solution and/or rinsing solution, and a gas/liquid recovery mechanism 112 as an exhaust mechanism that recovers such air and liquid. The gas/liquid recovery mechanism 112 is configured to be able to set a recovery amount of the air at an arbitrary predetermined amount. In other words, a region (second peripheral region β) to exhaust from inside the cup 110 is configured to enable an arbitrary predetermined amount to be set. In addition, the cup 110 is configured to be movable upwardly and downwardly by a cup moving mechanism (not shown).

Around the cup 110 is disposed a wall portion 113 that forms a wall of the processing chamber as a second enclosing member provided to enclose the cup 110. At a position below a region between the cup 110 and wall portion 113 is provided a gas recovery opening 116 that recovers at least part of the air from the air supplying mechanism 100 through a rectifying mechanism 115 provided with a plurality of recovery openings 114 that rectifies the current of air, and a gas recovery mechanism 117 as an exhaust mechanism that recovers such air. The gas recovery mechanism 117 is configured to be able to set a recovery amount of the air at an arbitrary predetermined amount. In other words, a region (first peripheral region α) to exhaust from the region between the cup 100 and wall portion 113 is configured to enable an arbitrary predetermined amount to be set.

Moreover, the wall portion 113 is provided with a carry-in/out opening 120 through which the arm 17 of the substrate carrying mechanism 10 that carries the semiconductor wafer W enters and exits the processing chamber. The wall portion 113 is further provided with a cover 121 as an opening and closing mechanism that opens and closes the carry-in/out opening 120 to interrupt the atmosphere between the processing chamber and an arrangement space of the substrate carrying mechanism 10 where the downflow DF is formed.

In addition, with respect to the relationship between the pressure inside the processing chamber and the arrangement space of the substrate carrying mechanism 10, the pressure inside the processing chamber is set to be higher. This is to prevent, for example, particles from entering the processing chamber from the arrangement space of the substrate carrying mechanism 10.

Accordingly, based on detected data of the sensor 82 provided inside the arrangement space of the substrate carrying mechanism 10, the control mechanism 31 controls an air supply amount from the air supplying mechanism 100 and/or an air recovery amount from the gas recovery mechanism 117 and/or an air recovery amount from the gas/liquid recovery mechanism 112. When the arm 17 of the substrate carrying mechanism 10 enters the processing chamber, the cover 121 is opened and the pressure inside the processing chamber decreases. The change in pressure is detected by the sensor 101, and when the decreased pressure inside the processing chamber is higher than that inside the process unit section PU (i.e., even the pressure inside the processing chamber decreases temporarily), it is not necessary to substantially vary, as compared to a set value during the processing of the semiconductor wafer W, a factor of varying the pressure inside the processing chamber, e.g., at least one factor among factors of air supply amount from the air supplying mechanism 100, air recovery amount from the gas recovery mechanism 117, and air recovery amount from the gas/liquid recovery mechanism 112.

Further, when the cover 121 is opened and the pressure inside the processing chamber is approximately the same as the pressure inside the process unit section PU or is to be maintained in a predetermined pressure difference, it is preferable, before opening the cover 121, instead of varying the air supply amount from the air supply mechanism 100, to vary at least one factor among the factors of the air recovery amount from the gas recovery mechanism 117, and air recovery amount from the gas/liquid recovery mechanism 112. In other words, to respond, it is preferable to decrease the recovery amount or to stop the recovery. The reason is that when the factor of varying the pressure is varied, a certain amount of time is required to reach the value set during the processing of the semiconductor wafer W, and the throughput of the processing is reduced.

Figure 5:
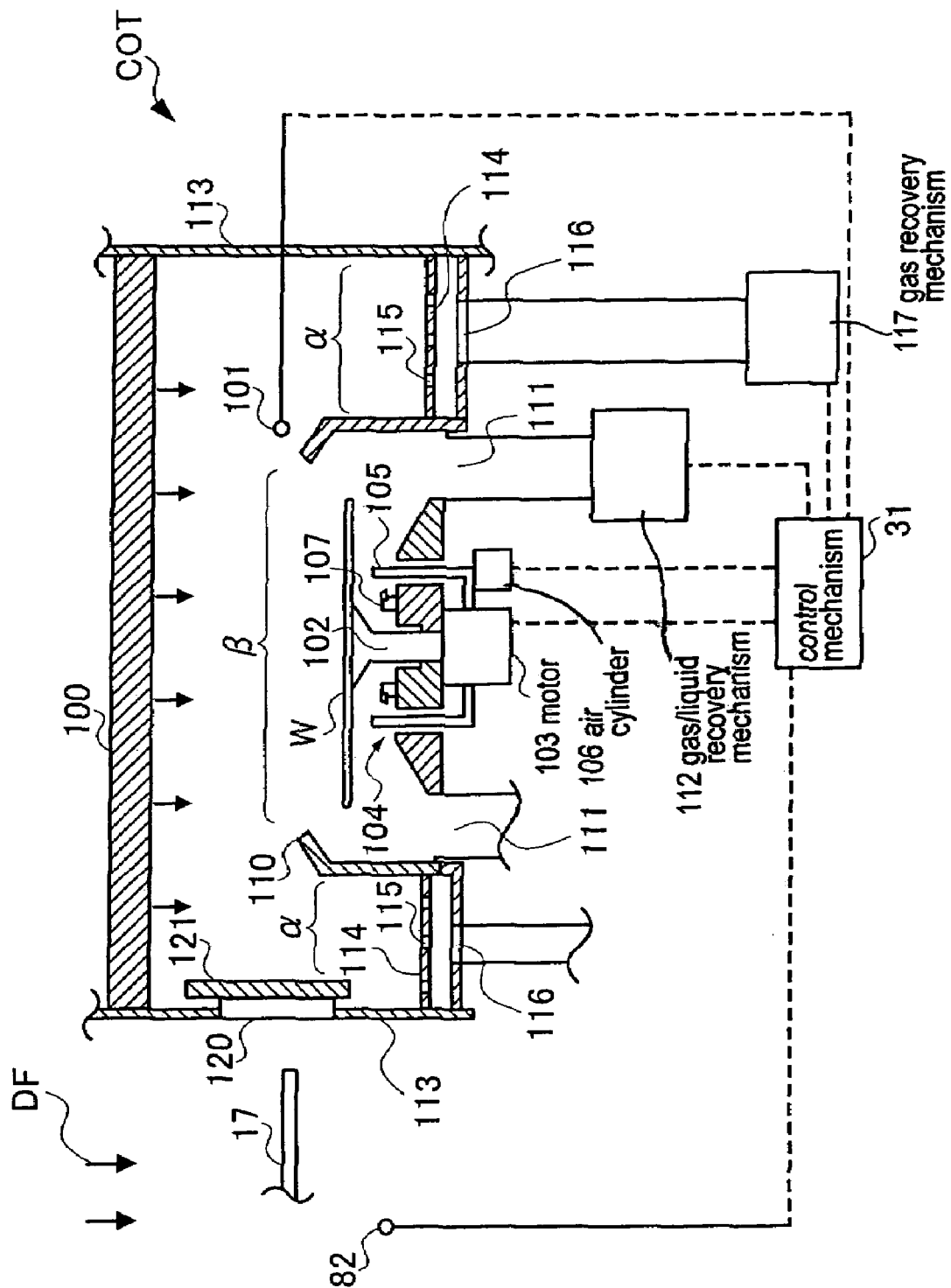
FIG. 5 is a schematic sectional view showing one embodiment of a coating processing section (COT)
Figure 6:
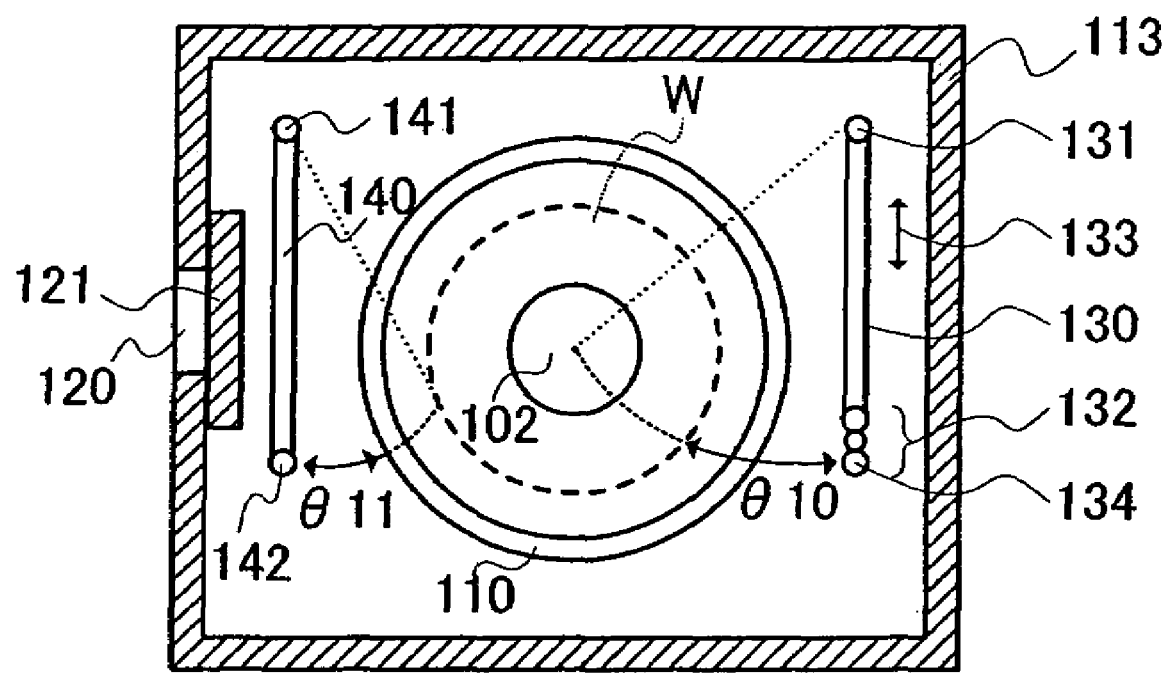
FIG. 6 is a schematic plan view to explain the coating processing section (COT) in FIG. 5.

Moreover, as shown in FIGS. 5 and 6, in the processing chamber is provided an arm 130 as an arm moving mechanism movable in the rotation direction θ10 on an axis portion 131 as a supporting point. On a front portion of the arm 130 is provided a resist nozzle group 132 that supplies to the semiconductor wafer W a plurality of kinds of coating solutions as a processing solution, for example, a resist solution. Movement of the arm 130 enables a specific resist nozzle 134 selected from the resist nozzle group 132 to supply the resist solution to the center and its vicinity of the processing surface of the semiconductor wafer W. The arm 130 is configured to enable itself to extend and shrink (in the direction 133 in the figure) to maintain the supply by the specific resist nozzle 134 selected from among the resist nozzle group 132 to the center and its vicinity of the processing surface of the semiconductor W at a constant position.

Further, as shown in FIGS. 5 and 6, in the processing chamber is provided an arm 140 as an arm moving mechanism movable in the rotation direction θ11 on an axis portion 141 as a supporting point. On a front portion of the arm 140 is provided a solvent nozzle 142 that supplies to the semiconductor wafer W a solvent liquid, for example, thinner liquid. Movement of the arm 140 enables the solvent nozzle 142 to supply the solvent liquid to the periphery portion of the processing surface of the semiconductor wafer W. It is configured to remove the resist film on the periphery of the semiconductor wafer W among resist films coated on the processing surface of the semiconductor wafer W using the solvent liquid.

The operation of the resist processing apparatus 1 configured as described above will be described. First, the cassette C storing a plurality of unprocessed semiconductor wafers W is placed in the cassette mount section U1 in the cassette unit section CU by an operator or cassette carrying robot.

Then, a sheet of the semiconductor wafers W is carried out of the cassette C on a single sheet basis from the substrate carrying in/out mechanism 2 in the substrate carrying in/out mechanism section U2, is positioned once by the mechanism 2, and provided to the substrate providing/receiving section 8 in the process unit section PU.

Then, the semiconductor wafer W is carried to the gas processing section by the arm 17 of the substrate carrying mechanism 10 in the process unit section PU, undergoes the hydrophobing processing in the gas processing section, set for a predetermined temperature, for example, a processing temperature in the coating processing section COT, in the temperature adjusting section, and then carried to the coating processing section COT by the arm 17 of the substrate carrying mechanism 10.

As a process for the arm 17 of the mechanism 10 to provide the semiconductor wafer W to the coating processing section COT, the arm 17 of the mechanism 10 that holds the semiconductor wafer W enters a position for providing/receiving the semiconductor wafer W in the coating processing section COT, the supporting pin 105 moves up by the air cylinder 106 to hold the semiconductor wafer W while separating the semiconductor wafer W from the arm 17 of the mechanism 10, and thus the wafer W is provided/received. Then, the arm 17 of the mechanism 10 retreats outside the coating processing section COT, the carrying-in/out opening 120 is closed by the cover 121, and the processing chamber is sealed. The supporting pin 105 that supports the semiconductor wafer W moves down by the air cylinder 106, and the semiconductor wafer W is provided from the supporting pin 105 onto the chuck 102 and is held thereon in vacuum attachment. At this point, it is substantially confirmed that the semiconductor wafer W is provided to the coating processing section COT by checking whether or not a predetermined pressure is maintained using a vacuum sensor. After this confirmation, the substantial coating process proceeds.

In addition, during the carrying process, the air from the air supplying mechanism 100 is recovered only from the gas recovery mechanism 117 and is not recovered from the gas/liquid recovery mechanism 112, or the recovery amount from the gas recovery mechanism 117 is set to be larger than that from the gas/liquid recovery mechanism 112. In this way, the air from the air supplying mechanism 100 is not pulled into the cup 110 and recovered from outside the cup 110 (first peripheral region $\alpha$), whereby it is possible to reduce particles adhered to the semiconductor wafer W in the cup 110 and to improve the yield of the semiconductor wafer W.

Next, in the coating process, after the cup 110 moves up, the semiconductor wafer W held on the chuck 102 in the cup 110 is rotated by the chuck 102, and by the movement of the arm 130, the specific nozzle 134 selected from among the resist nozzle group 132 supplies the resist solution to the center and its vicinity of the processing surface of the semiconductor wafer W. In addition, herein, for convenience, the semiconductor wafer W is rotated and then the resist solution is supplied to the semiconductor wafer W. However, it may be possible to supply the resist solution to the semiconductor wafer W, move the cup 110 up and rotate the semiconductor wafer W, or to move the cup 110 up, supply the resist solution to the semiconductor wafer W, and rotate the semiconductor wafer W. In this way, the film of resist solution is formed on the semiconductor wafer W.

During the coating process, the air from the air supplying mechanism 100 is recovered from the gas recovery mechanism 117 and gas/liquid recovery mechanism 112. At this point, the exhaust amount from the gas/liquid recovery mechanism 112 is larger than that in the carrying process. In other words, since the resist solution on the semiconductor wafer W is scattered in the direction of cup 110 by the rotation, it is required to exhaust so as to pull the scattered resist solution downwardly (i.e., the region inside the cup 110 to exhaust (second peripheral region $\beta$)). However, since it is necessary to maintain a constant pressure inside the processing chamber (when the pressure inside the processing chamber is not maintained constant, changes in pressure have significant effects on uniformity of the thickness of the resist film), it is necessary to decrease the exhaust amount exhausted from outside the cup 110 (first peripheral region $\alpha$) by an increase in exhaust amount exhausted from inside the cup 110. The exhaust amount of the gas recovery mechanism 117 is thus controlled by the control mechanism 31.

In addition, moving the cup 110 up during the coating process causes the cup 110 to be closer to the air inject opening of the air supplying mechanism 100 and limits the air taken inside the cup 110 to the air from the air supplying mechanism 100, so as to prevent the air outside the cup 110 from being swept in and entering the cup 110.

In other words, by thus changing currents of the air inside the processing chamber, the required currents are set before the processing and during the processing. By thus setting, it is possible to prevent, for example, unnecessary particles from entering the inside the cup 110 due to changes in exhaust, etc. from outside the cup 110, and to improve the yield in the processing of the semiconductor wafer W.

Next, in a process (edge remover process) of removing the resist film on the periphery portion of the semiconductor wafer W among the resist film coated on the processing surface of the semiconductor wafer W, the arm 140 moves in the rotation direction $\theta 11$, and supplies the solvent from the solvent nozzle 142 to the resist film on the periphery portion of the rotating semiconductor wafer W, and thus the unnecessary film is removed. In this process, the back nozzle 107 also discharges the thinner liquid to remove unnecessary film adhered to the back of the semiconductor wafer W. In addition, the condition of the cup and the operation on the air supply amount from the air supplying mechanism 100, exhaust amount from the liquid recovery mechanism 117, and exhaust amount from the gas/liquid recovery mechanism 112 are set at respective values the same as those in the coating process, consecutively.

Subsequently, the condition of the cup and the operation on the air from air supplying mechanism 100, liquid recovery mechanism 117, and the gas/liquid recovery mechanism 112 are set for respective conditions the same as those in the carrying process. The semiconductor wafer W is provided from the supporting pin 105 to the arm 17 of the substrate carrying mechanism 10 in the reverse order to the carrying process, and the processing in the coating processing section COT is finished.

Then, the semiconductor wafer W undergoes the thermal processing in a predetermined selected thermal processing section disposed at a position above the substrate providing/receiving sections 8 and 9, is transferred by the arm 17 of the substrate carrying mechanism 10 to a predetermined selected thermal adjusting section disposed at a position below the substrate providing/receiving sections 8 and 9 to be set for the predetermined temperature, is provided to the interface unit section IFU through the substrate providing/receiving section 9, further provided to the exposure apparatus 3 from the interface unit section IFU, and undergoes exposure processing.

The semiconductor wafer W subjected to the exposure processing is provided to the interface unit section IFU, and returned to the process unit section PU through the substrate providing/receiving section 9. Further, the semiconductor wafer W undergoes the thermal processing in a predetermined selected thermal processing section disposed at a position above the substrate providing/receiving sections 8 and 9 (particularly, in the case of resist film using exposure light with a frequency of 157 nm, while supplying clear air or nitrogen with moisture less than or equal to 45%, preferably less than or equal to 10%, more preferably less than equal to 5% and more than 0% to the processing chamber in the thermal processing section, the thermal processing is executed with such moisture maintained and the predetermined pressure set) The semiconductor wafer W is then transferred by the arm 17 of the substrate carrying mechanism 10 to a predetermined selected thermal adjusting section disposed at a position below the substrate providing/receiving sections 8 and 9 to be set for the predetermined temperature, and carried to the development processing section DEV.

As a process for the arm 17 of the substrate carrying mechanism 10 to provide the semiconductor wafer W in the development processing section DEV, the arm 17 of the mechanism 10 that holds the semiconductor wafer W enters a position for providing/receiving the semiconductor wafer W in the development processing section DEV, the supporting pin 36 in the holding mechanism 35 moves up by action of the air cylinder 50 to hold the semiconductor wafer W while separating the semiconductor wafer W from the arm 17 of the mechanism 10, and thus the wafer W is provided/received.

Then, the arm 17 of the mechanism 10 retreats outside the development processing section DEV, the carrying-in/out opening 80 is closed by the cover 81, and the processing chamber is sealed. The supporting pin 36 that supports the semiconductor wafer W moves down by action of the air cylinder 50, and the semiconductor wafer W is provided from the supporting pin 36 onto the chuck 32 and is held thereon in vacuum attachment.

At this point, it is substantially confirmed that the semiconductor wafer W is provided to the development processing section DEV by checking whether or not a predetermined pressure is maintained using a vacuum sensor. After this confirmation, the substantial development process proceeds. When it is not confirmed that the semiconductor wafer W is actually provided to the development processing section DEV by the vacuum sensor, i.e., a case in which the semiconductor wafer W is not provided and the operation in a subsequent process is executed, there arises the possibility that the semiconductor wafer W maybe broken, or that the processing may not be executed appropriately.

In addition, during the carrying process, the air from the air supplying mechanism 30 is recovered only from the gas/liquid recovery mechanism 77 and is not recovered from the gas/liquid recovery mechanism 71, or, the recovery amount from the gas/liquid recovering mechanism 77 is set to be larger than that from the gas/liquid recovering mechanism 71. In this way, the air from the air supplying mechanism 100 is not pulled into the cup 110 and recovered from outside the cup 110 (first peripheral region α), whereby it is possible to reduce the occurrence of particles adhered to the semiconductor wafer W in the cup 60, and to improve the yield in the processing of the semiconductor wafer W. (The carrying process is as described above.)

After the carrying process, in the case of a process of supporting the semiconductor wafer W on the supporting pin 36 to fill the developing solution, the supporting pin 36 is moved up from the chuck 32 that holds the semiconductor wafer W by action of the air cylinder 50, the semiconductor wafer W is again provided on the supporting pin 36 away from the chuck 32, and the supporting pin 36 and cup 60 are moved relatively to set a positional relationship between the cup 60 and the semiconductor wafer W on the supporting pin 36 as shown in FIG. 4C. The processing flow then shifts to the substantial development process.

In the development process, the development nozzle 90 moves in the horizontal direction X5 while discharging the developing solution from above the cup 60, the developing solution is supplied to the cup 60 and semiconductor wafer W at the same time, and filled on the semiconductor wafer W by a predetermined amount, and thus the development processing proceeds. After the solution is filled, the cup 60 is moved up so as to reduce the effect of the air from the air supplying mechanism 30 (in other words, a head portion of the cup 60 is set at a position higher than the processing surface of the semiconductor wafer W, preferably higher than the solution surface of the developing solution filled on the semiconductor wafer W and/or higher the developing solution to be filled. That is, the semiconductor wafer W is stored in the cup 60). In this way, since the current of air inside the processing chamber is changed, the air from the air supplying mechanism 30 is not pulled into the cup 60, and the current of air is generated toward the outside of the cup 60 above the semiconductor wafer W, and is recovered from outside the cup 60 (first peripheral region α). Therefore, it is possible to reduce the effect of the current of air on the developing solution filled on the semiconductor W inside the cup 60, and further to reduce adherence of particles contained in the current of air. It is thereby possible to improve the yield in the processing of the semiconductor wafer W. In addition, during the process, the operation of the gas/liquid recovery mechanisms 71 and 77 in recovery of the air from the air supplying mechanism 30 is maintained at the same operation as in the carrying process. (The development first process is as described above.)

Further, after the carrying process, in the case of a process of supporting the semiconductor wafer W on the chuck 32 to fill the developing solution, the supporting pin 36 and cup 60 are moved relatively to set a positional relationship between the cup 60 and the semiconductor wafer W on the supporting pin 36 as shown in FIG. 4C, and the processing flow shifts to the substantial development process.

In the development process, the development nozzle 90 moves in the horizontal direction X5 while discharging the developing solution from above the cup 60, and the developing solution is supplied to the cup 60 and semiconductor wafer W at the same time and filled on the semiconductor wafer W by a predetermined amount.

Then, the supporting pin 36 is moved up from the chuck 32 that holds the semiconductor wafer W by action of the air cylinder 50, the semiconductor wafer W is again provided on the supporting pin 36 away from the chuck 32, and the development processing on the semiconductor wafer W continues to proceed.

In addition, in the above process, the cup 60 is moved up so as to reduce the effect of the air from the air supplying mechanism 30 (in other words, a head portion of the cup 60 is set at a position higher than the processing surface of the semiconductor wafer W, preferably higher than the liquid surface of the developing solution filled on the semiconductor wafer W and/or higher than the developing solution to be filled. That is, the semiconductor wafer W is stored in the cup 60) . In this way, since the current of air inside the processing chamber is changed, the air from the air supplying mechanism 30 is not pulled into the cup 60, and the current of air is generated toward the outside of the cup 60 above the semiconductor wafer W, and is recovered from outside the cup 60 (first peripheral region α) Therefore, it is possible to reduce the effect of the current of air on the developing solution filled on the semiconductor W inside the cup 60, and further to reduce adherence of particles contained in the current of air. It is thereby possible to improve the yield in the processing of the semiconductor wafer W.

In addition, during the process, the operation of the gas/liquid recovery mechanisms 71 and 77 in recovery of the air from the air supplying mechanism 30 is maintained at the same operation as in the carrying process. (The development second process is as described above.) Both in the development first and second processes, subsequently, the supporting pin 36 that supports the semiconductor wafer W is moved down by action of the air cylinder 50, and the semiconductor wafer W is provided from the supporting pin 36 onto the chuck 32 and is held on the chuck 32 in vacuum attachment.

In addition, by selecting the development first process, particularly as compared with the development second process, since the semiconductor wafer W is supported in point-contact, it is possible to suppress fluctuations of temperatures between an area in contact with the semiconductor wafer W and the area in non-contact with the wafer better than in the surface contact, and to improve the yield of the semiconductor wafer W. Further, in supplying the processing solution to the semiconductor wafer W the processing solution is prevented from entering the back of the semiconductor wafer W to further move to the center portion of the back of the wafer W, and it is thereby possible to maintain the inside of the processing chamber or semiconductor wafer W in a cleaner state.

By selecting the development second process, particularly as compared with the development first process, since the semiconductor wafer W is in surface-contact in supplying the processing solution, it is possible to further suppress the displacement of the semiconductor wafer W due to the flow rate of the processing solution, force applied between the processing solution nozzle and semiconductor wafer W caused by the surface tension of the developing solution, etc. Furthermore, the solution is filled on the semiconductor wafer W effectively when the processing solution is supplied while rotating the semiconductor wafer W, for example, when a processing solution-supplying region of the processing solution nozzle is less than a diameter of the semiconductor.

Then, the chuck 32 is rotated at the number of rotations so as to not cause the developing solution on the semiconductor wafer W to spill, the rinse nozzle 91 supplies pure water and/or an aqueous solution obtained by adding a surfactant to pure water by an amount so as to not cause the developing solution on the semiconductor wafer W to spill, and the concentration of the developing solution on the semiconductor wafer W is diluted to a predetermined value (developing solution diluting process). As the reason for thus diluting the developing solution, in a latter half of the development process, it is possible to decrease unevenness of soluble product in the developing solution on the semiconductor wafer W partially generated by the soluble product dissolved in the developing solution, and to suppress an inconsistent partial critical dimension.

Thereafter, the rinse nozzle 91 supplies pure water, the semiconductor wafer W is rotated at high speed by the chuck 32 to substitute for the developing solution to be dried (rinse dry process). In this process, the air from the air supplying mechanism 30 is recovered from the gas/liquid recovery mechanism 77 and gas/liquid recovery mechanism 71. At this point, the exhaust amount from the gas/liquid recovery mechanism 71 is larger than that in the carrying process. In other words, since the developing solution on the semiconductor wafer W is scattered in the direction of cup 60 by the rotation, it is required to exhaust so as to pull the scattered developing solution downwardly (region inside the cup 60 to exhaust (second peripheral region β)). However, since it is necessary to maintain the constant pressure inside the processing chamber (when the pressure inside the processing chamber is not maintained constant, changes in pressure have significant effects on uniformity in the development processing), it is necessary to decrease the exhaust amount exhausted from outside the cup 60 (first peripheral region α) by an increase in exhaust amount exhausted from inside the cup 60. The exhaust amount of the liquid/gas recovery mechanism 77 is thus controlled by the control mechanism 31.

Then, the condition of the cup and the operation on a supply amount of the air from air supplying mechanism 30, exhaust amount from the gas/liquid recovery mechanism 77 and exhaust amount from the gas/liquid recovery mechanism 71 are set for respective states the same as those in the carrying process, and the semiconductor wafer W is provided from the supporting pin 36 to the arm 17 of the substrate carrying mechanism 10 in the reverse order to the carrying process. The processing in the development processing section DEV is thus finished.

Then, the semiconductor wafer W undergoes the thermal processing in a predetermined selected thermal processing section disposed at a position above the substrate providing/receiving sections 8 and 9, is transferred by the arm 17 of the substrate carrying mechanism 10 to a predetermined selected thermal adjusting section disposed at a position below the substrate providing/receiving sections 8 and 9 to be set for the predetermined temperature, is carried in the cassette C through the substrate providing/receiving section 8 by the substrate carrying in/out mechanism 2 of the substrate carrying in/out mechanism section U2 in the cassette unit section CU, and the series of processing steps is finished.

Another embodiment of the development processing method of this embodiment will be described below. In addition, the same structural elements as those in the above-mentioned embodiment are assigned with the same reference numbers so as to omit specific descriptions thereof.

In the development processing method as described earlier, the developing solution is filled on the semiconductor wafer W, the cup is moved upwardly and downwardly to change the current of air inside the processing chamber, and then the concentration of the developing solution is changed in the latter half of the development process. Generally, semiconductor plants use a single kind of developing solution with a concentration of, for example, 2.38%. However, resist patterns are made finer depending on devices, and an unexpected event can occur such that the concentration is too high for the development speed. Therefore, a method, for diluting the concentration of developing solution filled on the semiconductor wafer in the first half of the development process, will be described below.

When such processing is required, in the case of the development first process, the developing solution is filled on the semiconductor wafer W by a predetermined amount, the rinse nozzle 91 supplies pure water and/or an aqueous solution obtained by adding a surfactant to pure water by an amount so as to not cause the developing solution on the semiconductor W to spill while maintaining the liquid state, and the concentration of the developing solution on the semiconductor W is diluted to a predetermined value.

Further, in the development second process, the developing solution is supplied to the cup 60 and semiconductor wafer W at the same time, the developing solution is filled on the semiconductor wafer W by a predetermined amount, the chuck 32 is rotated at the number of rotations so as to not cause the developing solution on the semiconductor W to spill while maintaining the liquid state, the rinse nozzle 91 supplies pure water and/or an aqueous solution obtained by adding a surfactant to pure water by an amount not to cause the developing solution on the semiconductor W to spill, and the concentration of the developing solution on the semiconductor W is diluted to a predetermined value.

Then, the supporting pin 36 is moved up from the chuck 32 that holds the semiconductor wafer W by action of the air cylinder 50, the semiconductor wafer W is again provided onto the supporting pin 36, and the development processing on the semiconductor wafer W continues to proceed. Accordingly, after the developing solution is diluted, moving the cup 60 changes the current of air inside the processing chamber.

Also in such development first and second processes, the process as described earlier (developing solution diluting process) may be further added. Moreover, as another process for not performing the developing solution diluting process, for example, a rinse drying process may be performed. In the rinse drying process, after the semiconductor wafer W is provided from the supporting pin 36 onto the chuck 32 and held on the chuck 32 in vacuum attachment, the chuck 32 is rotated, for the first time, to cause the developing solution on the semiconductor wafer W to be blown off once, or to remain by a predetermined amount, i.e., before the developing solution is not dried up, the rinsing solution is supplied to the processing surface of the semiconductor wafer W that rotates, for the second time, less than the first rotation. Then, the semiconductor wafer W is rotated, for the third time, more than or approximately equal to the first rotations, to dry. Thus, it is possible to perform the processing as appropriate so as to correspond to the resist film formed on the semiconductor wafer W.

Another embodiment of the supporting mechanism 35 of this embodiment will be described below with reference to FIGS. 7A and 7B. In addition, the same structural elements as those in the above-mentioned embodiment are assigned with the same reference numbers so as to omit specific descriptions thereof.

Figure 7A:
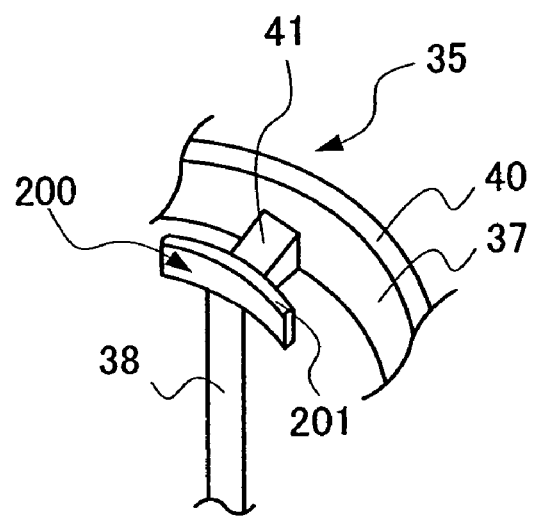
FIG. 7A is a schematic perspective view to explain a supporting mechanism in another embodiment of the development processing section (DEV)
Figure 7B:
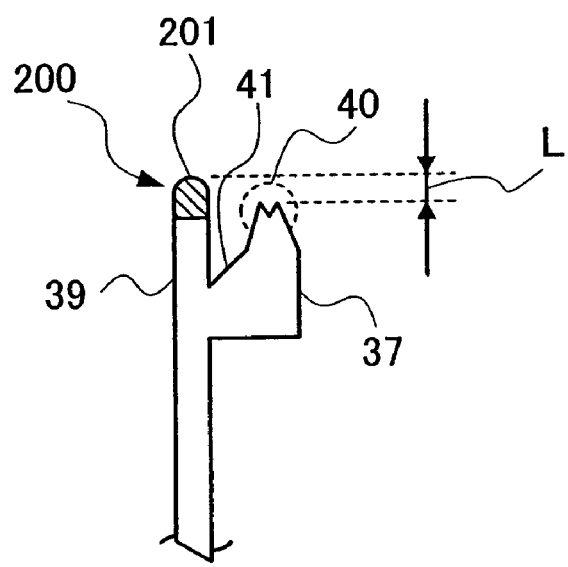
FIG. 7B is a schematic sectional view to explain the supporting mechanism in another embodiment of the development processing section (DEV)

As shown in FIGS. 7A and 7B, the supporting mechanism 35 is provided with a plurality of supporting members 200 which supports the back of the semiconductor wafer W in partial line-contact, for example, arranged at regular intervals in concentric positions of the semiconductor wafer W, a ring member 37 as a solution penetration preventing mechanism that is provided outside the supporting members 200 and prevents the processing solution such as the developing solution and rinsing solution from entering a center portion of the back of the semiconductor wafer W, and a plurality of supporting poles 38 that supports in one piece the ring member 37 and supporting members 200. The ring member 37 and supporting member 200 of the supporting mechanism are provided with a tilting portion 41 so that a position of the height thereof is lower toward the center of the semiconductor wafer W (in the direction away from the ring member 37 toward the supporting member 200).

Such a configuration prevents the rinsing solution or developing solution adhered to the asperity portion 40 or the rinsing solution that discharged from the back nozzle 51 to rinse the ring member 37, etc. from adhering to at least a contact portion 201 in contact with the semiconductor wafer W of the supporting mechanism 35. By thus configuring, it is possible to prevent the rinsing solution or developing solution from adhering to the semiconductor wafer W during processing, and it is thereby possible to suppress occurrences of partial temperature change of the semiconductor wafer W or generation of particles in the system caused by the rinsing solution or developing solution adhered to the semiconductor wafer W being dried, and to improve the yield of the semiconductor wafer W.

Further, as shown in FIG. 7B, heights and positions of supporting members 200 and ring member 37 are set so that supporting members 200 are higher by a predetermined length, for example, a length (L in the figure) ranging from 0.5 mm to 5 mm. This is to prevent the ring member 37 from coming into direct contact with the back of the semiconductor. The contact portion 201 of the supporting member 200 to be in contact with the back of the semiconductor W is formed of, for example, an elastic member, as a member having a higher coefficient of friction and lower thermal conductivity than those of a member 39 forming the supporting member 200, and also as a displacement preventing member that prevents occurrences of horizontal displacements including horizontal displacements in supporting the back of the semiconductor W, and further in supplying the solution to the semiconductor wafer W after supporting the back of the semiconductor W. The low thermal conductivity prevents the possibility that the uniformity in the surface is inhibited due to effects such as the heat escaping from the semiconductor wafer W through the contact portion with the supporting member 200 during the processing of the semiconductor wafer W. As materials for the contact portion 201, examples include engineering plastics such as PEEK.PBI, ceramics such as alumina. zirconium, and rubbers such as perfluoro-compounds.

In this embodiment, since the supporting members 200 are configured to support the back of the semiconductor wafer W in a plurality of partial line-contacts, it is possible to support the semiconductor wafer W in a horizontal state as compared to point-contact. Therefore, it is possible to decrease the distance between the ring member 37 and the back of the semiconductor wafer W, and to prevent the processing solution from entering the center portion of the back of the semiconductor wafer W.

Further, since the friction to support the back of the semiconductor wafer W is increased as compared to the point-contact, it is possible to prevent the semiconductor wafer W from being displaced horizontally. In addition, when the line-contact of the supporting member 200 is excessively increased, for example, in the form of a ring, there is a risk that ring-shaped unevenness may occur on the processing surface of the semiconductor wafer W in the processing on the semiconductor wafer W. Accordingly, it is necessary to set line-contact to the extent of not causing the processing unevenness on the processing surface of the semiconductor wafer W. However, in the foregoing, while it is stated that a ring-shaped supporting member 200 is not preferable in this particular embodiment, as a matter of course, a ring-shaped member is acceptable when the processing specifications can accommodate the shape of a ring.

Another embodiment of the supporting mechanism 35 and back nozzle 51 in this embodiment will be described below. In addition, the same structural elements as those in the above-mentioned embodiment are assigned with the same reference numbers so as to omit specific descriptions thereof.

The process of discharging pure water from back nozzle 51 is used to rinse and remove the developing solution and/or pure water held in the asperity portion 40 of the ring member 37 using the surface tension or washing the developing solution or others adhered to the back of the semiconductor wafer W, after the development process and the process of diluting the developing solution held in the asperity portion 40 of the ring member 37 using the surface tension. However, before the processing solution is supplied to the semiconductor wafer W, i.e. before the development process, the back nozzle 51 discharges pure water to the asperity portion 40 of the ring member 37, so that the pure water film is temporarily formed between the ring member 37 and the back of the semiconductor wafer W using the surface tension. In this way, the concentration of the developing solution between the ring member 37 and the back of the semiconductor wafer W is decreased after the development process, thereby facilitating the rinsing, and enabling decreased rinsing time and reduced mists.

Figure 8A:
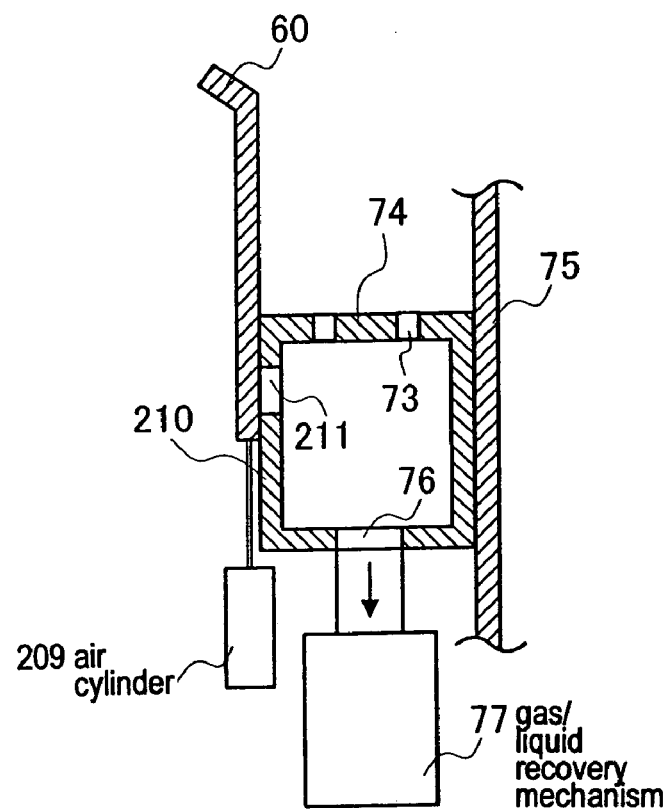
FIG. 8A is a schematic sectional view showing a primary portion in another embodiment of the development processing section (DEV)
Figure 8B:
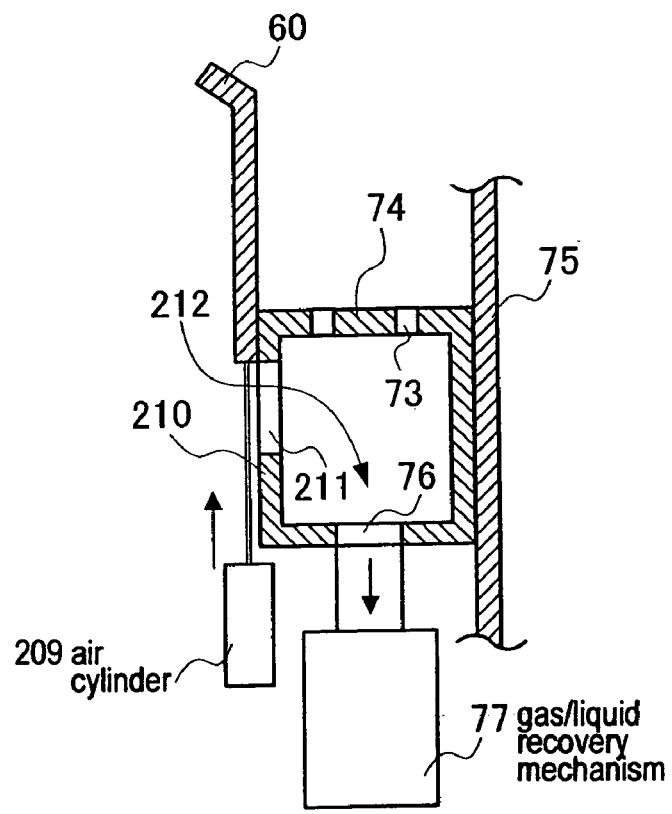
FIG. 8B is another schematic sectional view showing the primary portion in another embodiment of the development processing section (DEV)

Referring to FIGS. 8A and 8B, another embodiment will be described below in the relationship between gas/liquid recovery mechanisms 71, 77, and 112, gas recovery mechanism 117 and cups 60 and 110 of this embodiment. In addition, the structural elements as those in the above-mentioned embodiment are assigned with the same reference numbers so as to omit specific descriptions thereof. For convenience, the description is provided with reference to the development processing section DEV.

As shown in FIG. 8A, the cup 60 is connected to a cup moving mechanism that moves upwardly and downwardly, for example, air cylinder 209, and is configured to be movable upwardly and downwardly. A wall 210 is disposed between the cup 60 and gas/liquid recovery mechanism 77 (gas recovery mechanism 117 in COT) that exhausts the air/liquid from a region outside the cup 60, and on the wall 210 is provided, as shown in FIG. 8B, a ventilation opening 211 to provide the current of air 212 for causing the ambient air inside the cup 60 to flow into the gas/liquid recovery mechanism 77 (gas recovery mechanism 117 in COT) at the same time as the upward movement of the cup 60 by the air cylinder 209. The gas variation mechanism is thus configured.

Such a configuration enables eliminating the gas/liquid recovery mechanism 71. In COT, adding the liquid recovery function to the gas recovery mechanism 117 enables eliminating the gas/liquid recovery mechanism 112. This results in the advantage of being able to downsize the system.

Further, since a single exhaust mechanism provides control inside the processing chamber, maintaining the pressure inside the processing chamber in the relationship in air between the air supplying mechanisms 30 and 100, is made easier. It is therefore possible to reduce the effects on the processing of the semiconductor wafer W in the processing chamber, and to improve the yield of the processing.

In addition, the gas variation mechanism is not limited to the above-mentioned embodiment, as long as a mechanism generates variations in the current of air. For example, as long as the air is exhausted from inside the cup at the same time as, or is based on the movement of the cup, any physical or electrical mechanisms are applicable. Further, by thus configuring, in the case of making an exhaust amount from the first peripheral region approximately equal to an exhaust amount from the first and second peripheral regions, even the cup 60 moves upwardly and downwardly mechanically, since the entire amount of the exhaust is always constant, control of the system is made easier, and the system is more miniaturized.

Furthermore, when the exhaust area of the first peripheral region is different from the exhaust area of the second peripheral region, for example, the exhaust area of the first peripheral region is larger than the exhaust area of the second peripheral region, a single exhaust system works automatically at the same time as the upward and downward movement of the cup 60. Thus, control is made easier, and it is also possible to improve the stability of the pressure inside the processing chamber. As a result, it is possible to improve the yield of the processing on the substrate.

Moreover, when the exhaust time in the first peripheral region is different from the exhaust time in the second peripheral region, for example, the exhaust time in the first peripheral region is longer than the exhaust time in the second peripheral region, a single exhaust system works automatically at the same time as the upward and downward movement of the cup 60. Thus, control is made easier, and it is also possible to improve the stability of the pressure inside the processing chamber. As a result, it is possible to improve the yield of the processing on the substrate.

Figure 9:
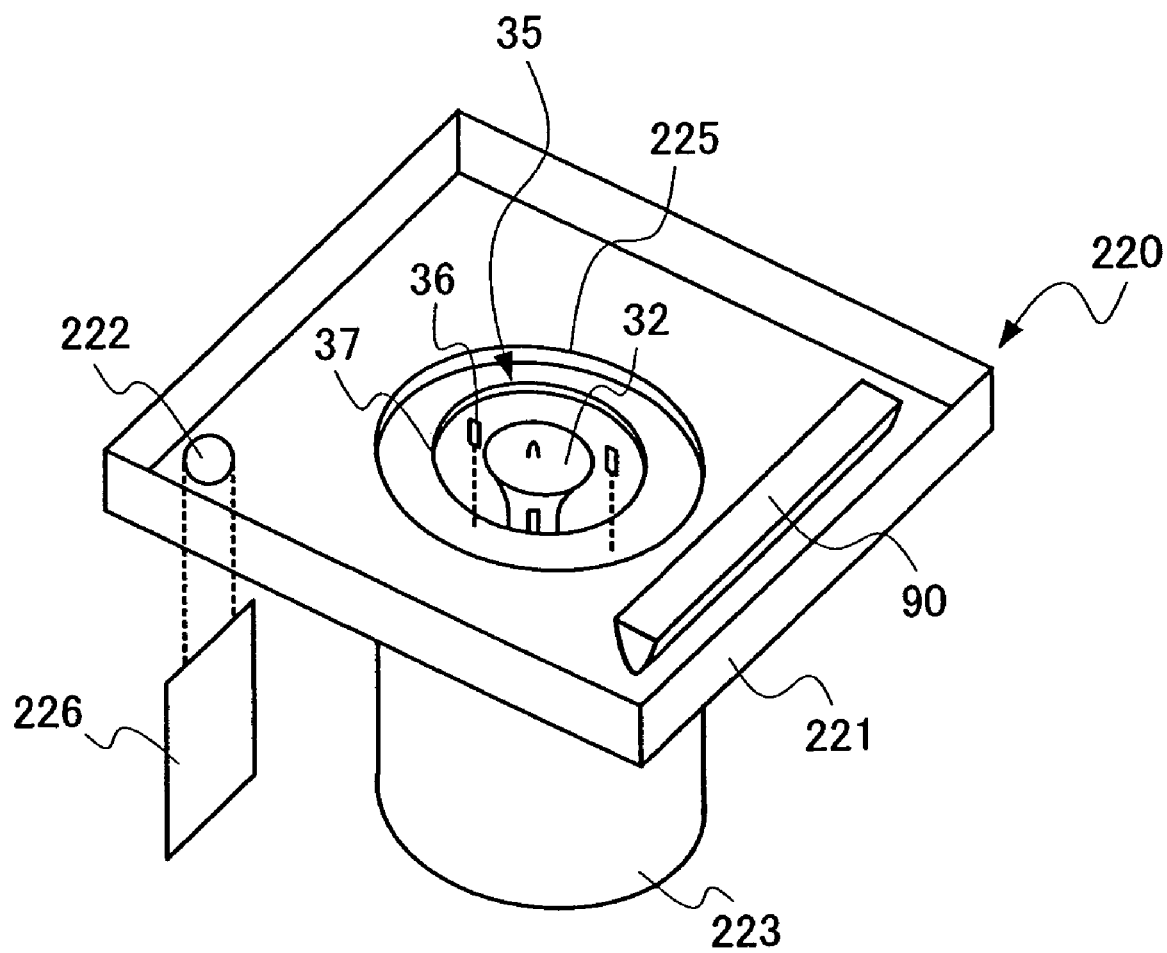
FIG. 9 is a schematic perspective view showing an embodiment of another cup in the development processing section (DEV)

Referring to FIG. 9, another embodiment will be described below for the cup 60 in development processing section DEV of this embodiment. In addition, the same structural elements as those in the above-mentioned embodiment are assigned with the same reference numbers so as to omit specific descriptions thereof.

A cup 220 is provided with a rectangular portion 221 in the form of a rectangle and a cylindrical portion 223 in the form of a cylinder provided inside the rectangular portion 221 with a head portion 225 projecting therefrom. The rectangular portion 221 (having a form of the cup 60 provided with the rectangular portion 221) is provided with a recovery opening 222 that recovers the processing solution such as the developing solution discharged from the development nozzle 90, and pure water discharged from the rinse nozzle 91. The processing solution recovered from the recovery opening 222 is recovered by a liquid recover mechanism 226. In addition, a region (first region) surrounded by the rectangular portion 221 is set to be larger in size than a region (second region) surrounded by the cylindrical portion 223.

Since the cup 220 is thus configured, the rectangular portion 221 is capable of recovering the development solution discharged from the development nozzle 90 and pure water discharged from rinse nozzle 91, and it is possible to configure the gas/liquid recover mechanism 77 as a mechanism that recovers only the gas. This reduces the size of the system corresponding to the reduced mechanism.

Further, since it is possible to suppress the adherence of processing solution such as the developing solution and rinsing solution to the wall portion 75 forming the first peripheral region α, the processing chamber can be cleaner, and it is possible to suppress generation of mists/particles. Any developing solution that adheres to the rectangular portion 221 is rinsed by pure water discharged from the rinse nozzle 91.

The processing in the cup 220 is carried out with the same processing procedures as described earlier. The processing surface of the semiconductor wafer W is set to be the same height as or higher than the head portion 225 (at this point, in the first region as a region surrounded by the rectangular portion 221). The development nozzle 90 moves horizontally, and concurrently supplies the developing solution to the processing surface of the semiconductor wafer W and the head portion 225 of the cup 220. Thus the developing solution is filled on the processing surface of the semiconductor wafer W.

In addition, the positional relationship between the head portion 225 and the semiconductor wafer W is set in the same way as in the positional relationship between the cup 60 and wafer W, and when the form of the head portion 225 is defined as the same form of a head portion of the cup 60, the same effects as described earlier are obtained.

Further, the height of the head portion 225 is set higher than the height of the processing surface of the semiconductor wafer W to obtain the above-mentioned effects. By thus setting the height, it is possible to further suppress effects of the current of air in exhaust from outside the head portion 225 on the developing solution filled on the processing surface of the semiconductor wafer W, and to improve the yield of the processing.

Then, as described earlier, the cup 220 is moved up, and the semiconductor wafer W is placed in a region (second region) enclosed by the cylindrical portion 223 to continue the development processing. Thus, since the cup 220 is formed of the cylindrical portion 223 provided with the rectangular portion 221, the exhaust from the first peripheral region α is performed in a position away from the cylindrical portion 223, and the current of air inside the processing chamber affects less the semiconductor wafer W in the cylindrical portion 223. It is thereby possible to improve the yield of the semiconductor wafer W. In addition, although in this embodiment the first region of the cup 220 is in the form a rectangle, the region may be in the form of a circle. Further, the form of the region is not limited to the above-mentioned forms, and may include any forms as long as a region (second region) enclosed by the cylindrical portion 223 is smaller in size than a region (first region) enclosed by the rectangular portion 221.

Figure 10:
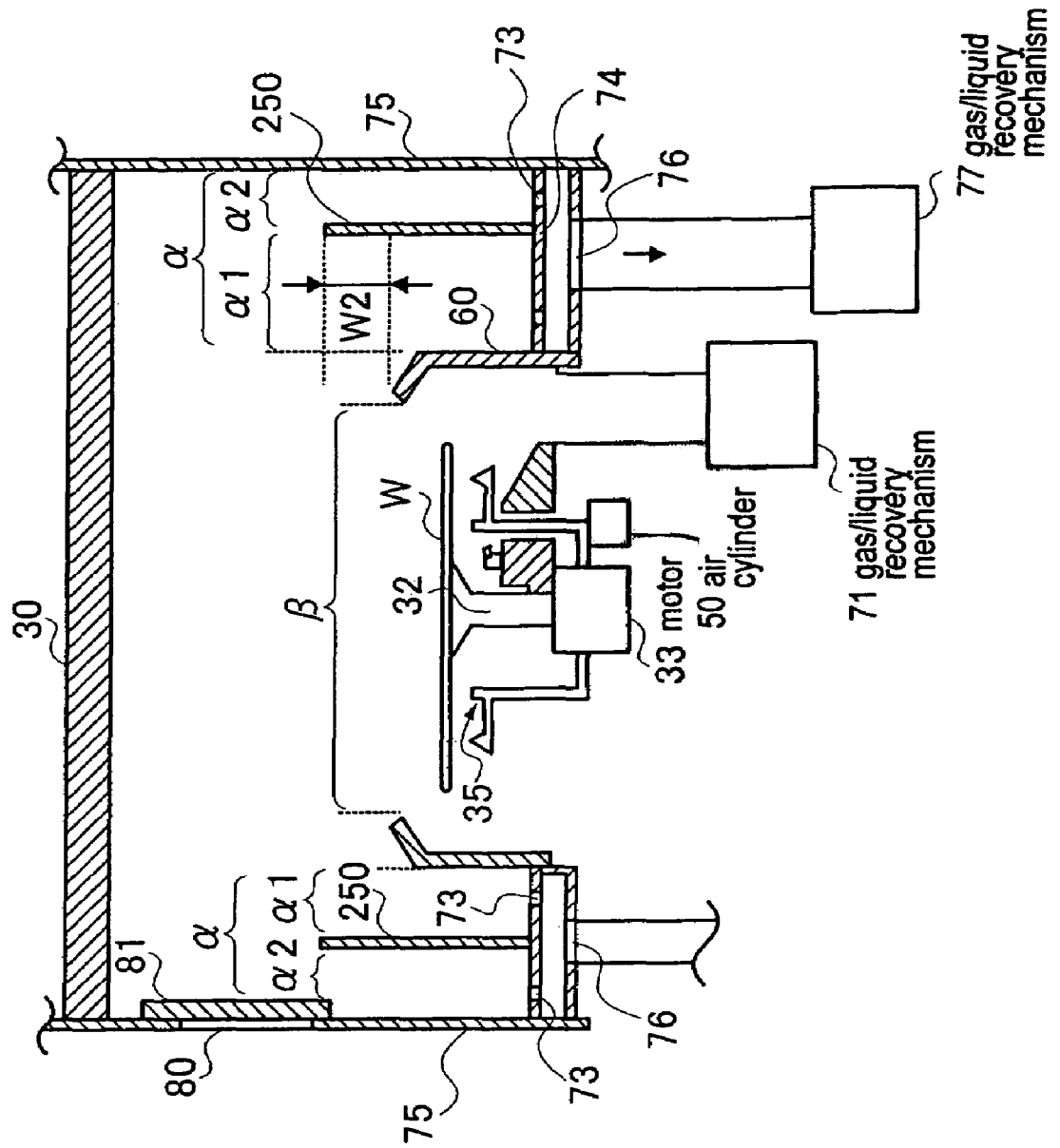
FIG. 10 is a schematic sectional view showing another embodiment of the development processing section (DEV)
Figure 11:
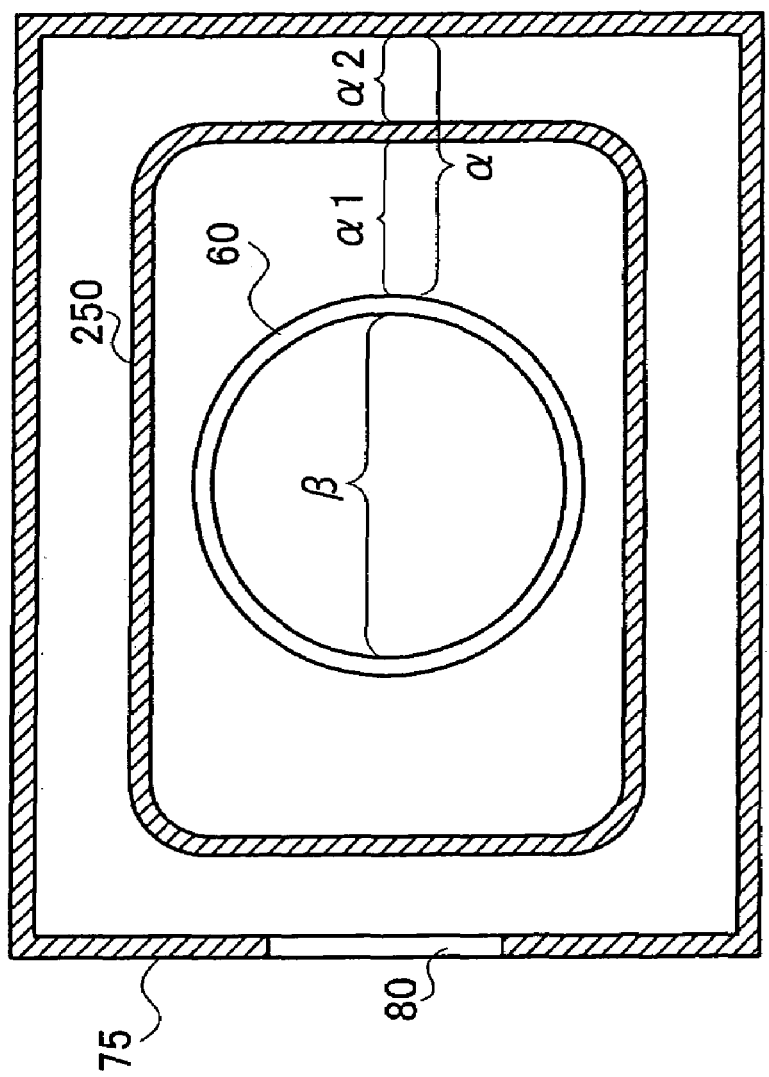
FIG. 11 is a schematic plan view to explain the development processing section (DEV) in FIG. 10.

Another embodiment of the development processing section DEV of this embodiment will be described with reference to FIGS. 10 and 11. In addition, the same structural elements as those in the above mentioned embodiment are assigned with the same reference numbers so as to omit specific descriptions thereof.

In this embodiment, a wall 250 is provided above the rectifying mechanism 74 as an enclosing member, and is configured to divide a region (first peripheral region α) to exhaust from between the cup 60 and wall portion 75. In other words, for the region (second peripheral region β) to exhaust from inside the cup 60, there are set a region (first peripheral region α1) between the cup 60 and wall 250 and a region (first peripheral region α2) between the wall 250 and wall portion 75. The wall 250 is set higher than the head portion of the cup 60 by a predetermined length (W2 in the figure). This structure prevents the developing solution from the development nozzle 90 and, for example, pure water from the rinse nozzle 91 from adhering directly to the wall portion 75 of the processing chamber. Accordingly, the wall 250 has the function of a second cup as a liquid scattering preventing mechanism.

In this way, it is possible to prevent developing solution from the development nozzle 90 and, for example, pure water from the rinse nozzle 91, from adhering directly. When the wall 250 is detachable, it is possible to clean or exchange only the wall 250 during maintenance such as cleaning of the processing chamber, and to reduce the maintenance time.

Further, since it is also possible to prevent the developing solution from development nozzle 90 and, for example, pure water from the rinse nozzle 91, from adhering to the cover 81, it is possible to prevent, for example, the developing solution adhered to the cover 81 from drying, scattering during the opening and closing of the cover 81, and adhering to the semiconductor wafer W as particles in the processing chamber.

In addition, the wall 250 is set higher than the head portion of the cup 60 by a predetermined length (W2 in the figure). But, the configuration is not limited to such a structure, as long as the wall 250 is spaced from the cup 60 to some extent. In other words, the wall 250 is capable of preventing the developing solution from development nozzle 90 or, for example, pure water from the rinse nozzle 91, from directly adhering to the wall portion 75 of the processing chamber.

In addition, the integrally formed supporting members 200 and ring member 37 have been described as the supporting mechanism 35, but the invention is not limited to such a structure. For example, with the positional relationship between the supporting members 200 and ring member 37 maintained as described above, the members 200 and 37 may be provided as a separate member to move upwardly and downwardly independently of each other as an upward/downward mechanism, and operate as is appropriate to perform the predetermined processing. Further, any other methods are available as long as the effectiveness of the supporting members 200 and ring member 37 is implemented.

Another embodiment of the supporting mechanism 35 of this embodiment will be described with reference to FIGS. 12A and 12B. In addition, the same structural elements as those in the above-mentioned embodiment are assigned with the same reference numbers so as to omit specific descriptions thereof.

Figure 12A:
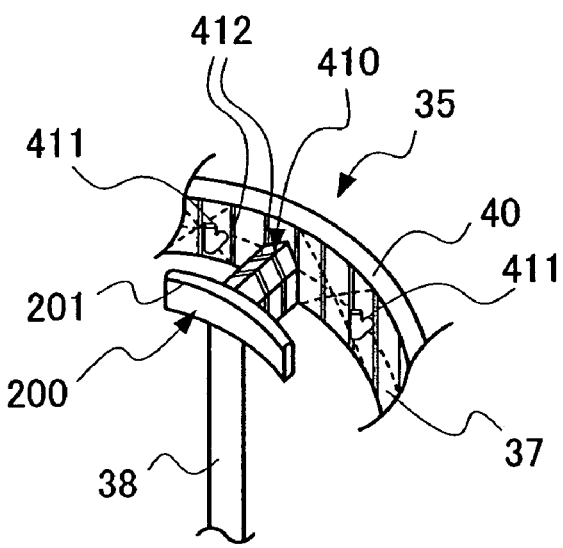
FIG. 12A is a schematic perspective view to explain a supporting mechanism in another embodiment of the development processing section (DEV)
Figure 12B:
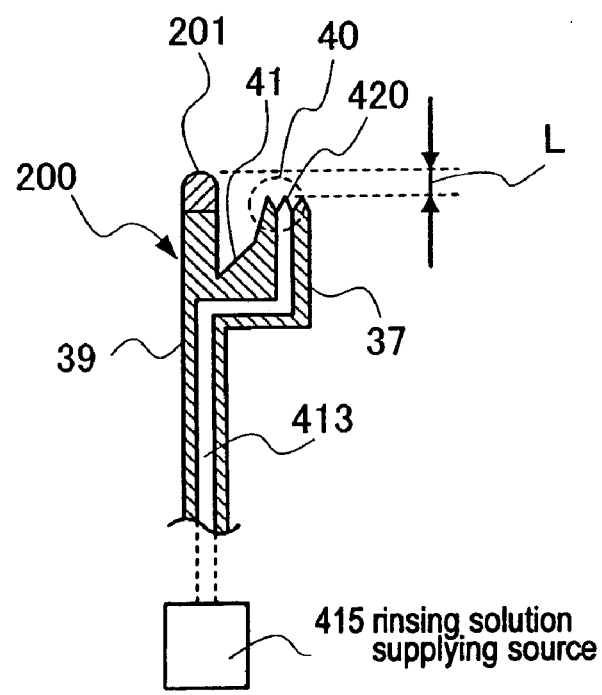
FIG. 12B is a schematic sectional view to explain the supporting mechanism in another embodiment of the development processing section (DEV)

As shown in FIGS. 12A and 12B, the supporting mechanism 35 is provided with a plurality of supporting members 200 that supports the back of the semiconductor wafer W in partial line-contact, a ring member 37 as a solution penetration preventing mechanism that is provided outside the supporting members 200 and prevents the processing solution such as the developing solution or rinsing solution from entering a center portion of the back of the semiconductor wafer W, and a plurality of supporting poles 38 that supports in one piece the ring member 37 and supporting members 200.

The asperity portion 40 of the ring member 37 is provided with a solution-supplying opening 420 that supplies the rinsing solution, and the rinsing solution is arbitrarily supplied from a rinsing solution-supplying source 415 via piping 413. The ring member 37 is provided with a plurality of rinse nozzles 411 that supplies, for example, the rinsing solution, or, for example, cleaning solution from the rinsing solution supplying source 415, to at least the ring member 37 and tilting portion 41. A center portion 410 of the tilting portion 41 is in the form of a peak, and on its surface is provided a groove 412 to promote the draining as in the side wall of the ring member 37.

By thus configuring the supporting mechanism 35, the solution supplying opening 420 that supplies the rinsing solution is effective in that the water film formed with the back of the semiconductor wafer W is more reliable than with the supply from the back nozzle 51. In this case, it may be possible to also use the back nozzle 51, or to form the water film using only the rinsing solution from the solution supplying opening 420. It is possible to clean the asperity portion 40 and the ring member 37 more reliably after the development process.

Further, the rinsing solution is injected from the solution supplying opening 420 and rinse nozzle 411, and the solution is drained efficiently by the groove 412, whereby it is possible to clean the ring member 37 more reliably and faster, to prevent mists adhered to the ring member 37 from being generated as particles when the ring member 37 dries, and to increase the yield of the semiconductor wafer W.

In addition, it is preferable that the rinsing solution from the rinse nozzle 411 and/or back nozzle 51 does not adhere to the contact portion 201 in contact with the back of the semiconductor wafer W. This is to prevent the rinsing solution or developing solution from adhering to the semiconductor wafer W during the processing, or during subsequent processing of semiconductor wafer W. This suppresses occurrences of partial temperature change of the semiconductor wafer W, or forming of particles in the system caused by the rinsing solution or developing solution adhered to the semiconductor wafer W being dried, and improves the yield of the semiconductor wafer W.

Still another embodiment of the supporting mechanism 35 of this embodiment will be described with reference to FIG. 13. In addition, the same structural elements as those in the above-mentioned embodiment are assigned with the same reference numbers so as to omit specific descriptions thereof.

Figure 13:
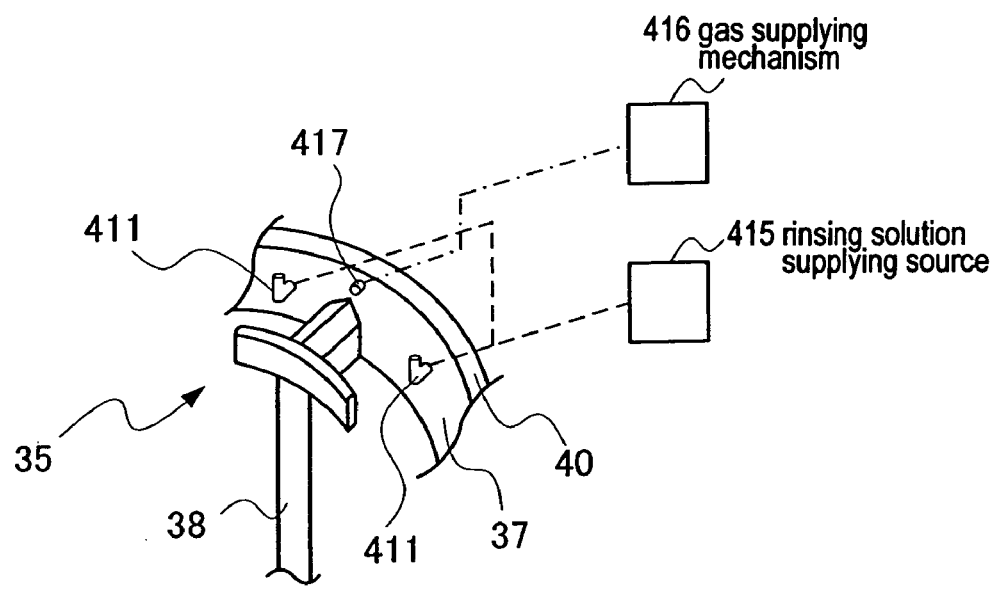
FIG. 13 is a schematic sectional view to explain a holding mechanism in still another embodiment of the development processing section (DEV)

As shown in FIG. 13, in the supporting mechanism 35, the plurality of rinse nozzles 411 provided in the rinse member 37 supplies the rinsing solution from the rinsing solution supplying source 415. The supporting mechanism 35 is further provided with a plurality of gas nozzles 417 (for convenience, a single nozzle is shown in the figure) that injects gas such as, for example, cleaning air and nitrogen from a gas supplying mechanism 416.

By thus configuring, it is possible to implement the drying process more reliably and faster after the development process and subsequent rinsing by the rinse nozzles 411, and to improve the throughput of the processing.

Still another embodiment of the supporting mechanism 35 of this embodiment will be described with reference to FIG. 14. In addition, the same structural elements as those in the above-mentioned embodiment are assigned the same reference numbers so as to omit specific descriptions thereof.

Figure 14:
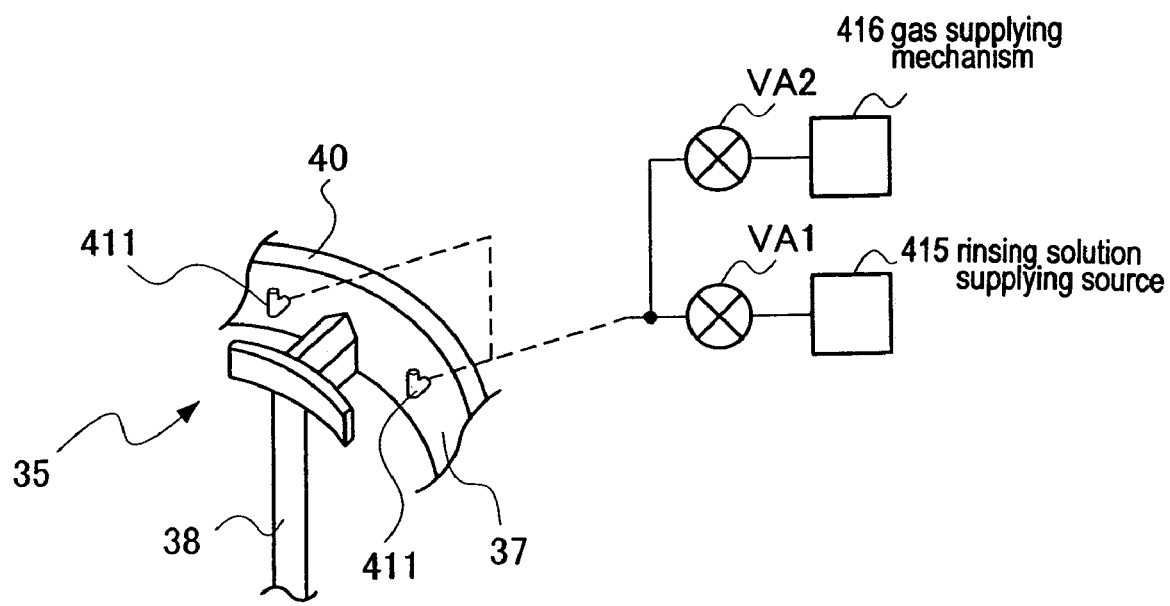
FIG. 14 is a schematic sectional view to explain a supporting mechanism in still another embodiment of the development processing section (DEV)

As shown in FIG. 14, in the supporting mechanism 35, the plurality of rinse nozzles 411 provided in the rinse member 37 supplies the rinsing solution from the rinsing solution supplying source 415 through a valve VA1, and is configured to enable injection of gas such as, for example, cleaning air and nitrogen from a gas supplying mechanism 416 through a valve VA2.

In this way, since the rinse nozzles 411 are capable of discharging the rinsing solution and gas selectively as is appropriate by switching between valves VA1 and VA2, discharging the gas after discharging the rinsing solution from the rinse nozzles 411 allows the rinsing solution that adheres to the nozzles 411 to be blown off. It is thus possible to implement the drying process more reliably and faster after rinsing, and to improve the throughput. Further, the need to provide the rinse nozzle and gas nozzle separately is eliminated, and it is possible to simplify and reduce in size the system of the ring member 37.

Figure 15:
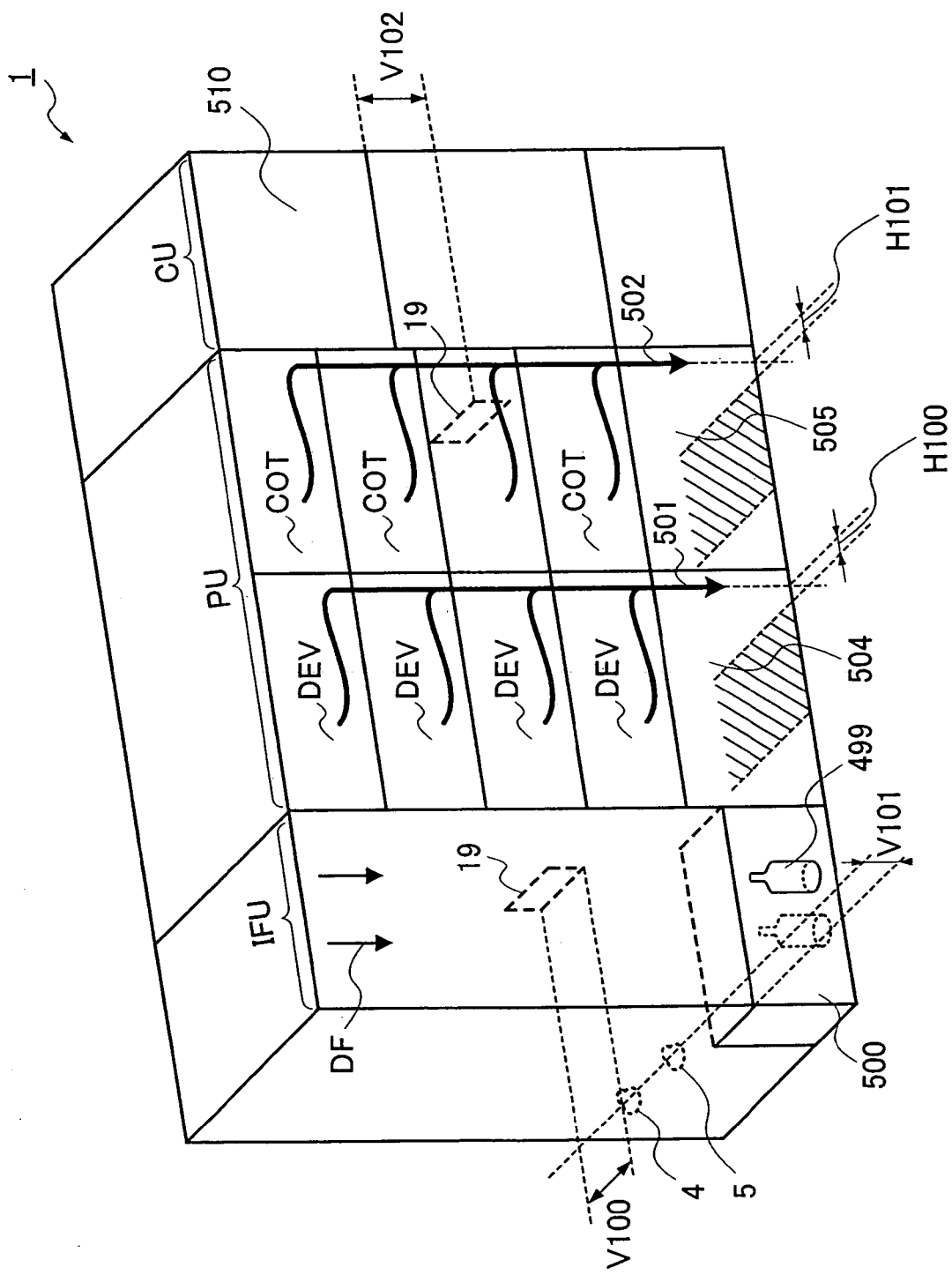
FIG. 15 is a perspective view to explain a location where a storage container that stores a processing solution is placed in a solution processing apparatus.

Referring to FIG. 15, an embodiment will be described of a location of a storage container that stores processing solutions used in the coating processing section COT and/or development processing section DEV as solution processing apparatuses in the resist processing apparatus 1 of this embodiment. In addition, the same structural elements as those in the above-mentioned embodiment are assigned the same reference numbers to omit specific descriptions thereof.

As shown in FIG. 15, the storage container 499 is placed at a position below the interface unit section IFU. The position is located below, by the distance V101 in the vertical direction, the providing section 4 or receiving section 5 which provides or receives a substrate to/from the exposure apparatus 3 and which is disposed below, by the distance V100 in the vertical direction, the lower portion of the substrate carrying in/out opening 19 of the substrate receiving and providing sections 8 and 9.

The purpose of specifying such a position is to suppress possible adverse effects such as deterioration of the processing solution, for example, the resist solution or the developing solution, due to thermal effects. In other words, the reason for placing the container at a position below the substrate carrying in/out opening 19 is to prevent the heat from the thermal processing section or others in the process unit section PU from being conveyed through the substrate carrying in/out opening 19.

The reason for placing the container at a position below the providing section 4 or receiving section 5 which provides or receives a substrate to/from the exposure apparatus 3, is to prevent the heat from being conveyed from the exposure apparatus 3 through the providing section 4 or receiving section 5. Further, it is possible to suppress the heat from walls, because the heat propagation from the substrate carrying in/out section 19, providing section 4 and/or receiving section 5 affects upper portions of walls rather than the lower portions.

Furthermore, the interface unit section IFU is configured so that the downflow DF with the controlled temperature directly acts on at least the substrate carrying in/out opening 19, providing section 4, and/or receiving section 5, and is thus configured so as to relieve the heat propagation from the substrate carrying in/out opening 19, providing section 4, and/or receiving section 5.

In order to further suppress the heat from the wall partitioning the interface unit section IFU and process unit section PU, exhaust of processing sections in the process unit section PU, for example, a plurality of development processing sections DEV (or a plurality of coating processing sections COT) is collectively performed on the cassette-unit-section side in a respective block, and exhaust passages 501 and 502 are formed for each block. Similarly, in thermal processing sections in the process unit section PU, exhaust passages (not shown) are formed and provided on the cassette-unit-section side for each block of each of the same kind of thermal processing sections related in the processing temperature.

As a position for placing the storage containers each storing a processing solution practically used in the coating processing section COT and/or development processing section DEV, for example, resist solution or developing solution, it is considered to place the container at positions 504 and 505 below the processing sections in the process unit section PU, for example, a plurality of development processing sections DEV (or a plurality of coating processing sections COT). In this case, it is not preferable to place the storage containers in areas immediately below the exhaust passages 501 and 502 for each block, or to place the containers in contact with walls in which the exhaust passages 501 and 502 are provided. It is preferable to place the container spaced from a position immediately below the exhaust passages 501 and 502 for each block by the distances H100 and H101 in the horizontal direction (for eliminating the effect of heat), respectively.

Further, with respect to a position of locating a control apparatus, as a heat source of the solution processing apparatus 1, which controls the entire apparatus, it is not preferable to locate the control apparatus in the interface unit section IFU or in the process unit section PU. It is preferable to locate the control apparatus in the cassette unit section CU. Furthermore, in order to prevent the heat from being conveyed to each processing section in the process unit section PU or being conveyed to the interface unit section IFU through the process unit section PU, the control apparatus is located above the upper portion of the substrate carrying in/out opening 19 of the substrate providing/receiving sections 8 and 9 by the distance V102 in the vertical direction.

As described above, in further consideration of the effects of heat inside the apparatuses, it is possible to suppress, for example, deterioration of the processing solution, while suppressing thermal effects on the substrate, and to improve the yield of the substrate.

Further, in the substrate as described above, a semiconductor wafer is used to explain the invention. However, the substrate is not limited to the wafer, and may be, for example, a glass substrate such as an LCD substrate, or a disk substrate such as a CD.

The solution processing is not limited to development and coating, and may be used in other apparatuses such as a cleaning apparatus, and further, is not limited to the above embodiments, as long as the methods and apparatuses use a processing solution.

As described above, the present invention allows exhaust mainly from the first peripheral region around the substrate undergoing the processing, and further, from the second peripheral region between the first peripheral region and the substrate. This results in reduced effects of the flow of air on the developing solution on the substrate, and further enables the developing solution for use in development processing to act on the exposed resist on the substrate. This provides the advantages of enhancing the uniformity in the processing of the substrate, and improving the yield according to the processing of the substrate.

The above description of the embodiments is intended to exemplify the technical ideas of the present invention and is not intended to be restrictive. The present invention is not limited to the above-described embodiments, and is capable of being carried into practice with various modifications thereof without departing from the scope of the present invention.

This application is based on Japanese Patent Application No. 2002-244352 filed on Jul. 22, 2002, the entire content of which is expressly incorporated by reference herein.

What is claimed is:

1. A substrate processing apparatus comprising:
a cassette unit section configured to enable a cassette that stores a non-processed substrate to be placed therein;
an interface unit section configured to enable the non-processed substrate to be provided and received between the interface unit section and another apparatus that performs exposure processing on the non-processed substrate with a resist film formed thereon;
a resist coating processing section that is disposed between the interface unit section and the cassette unit section and that is provided by stacking at least two resist coating mechanisms each of which coats a resist solution on the non-processed substrate to form a resist film;
a developing processing section that is disposed between the interface unit section and the cassette unit section, and that is provided by stacking at least two developing processing mechanisms each of which supplies a developing solution to the non-processed substrate with the resist film formed thereon to perform developing processing; and
an exhaust path that exhausts air from the resist coating mechanisms in the resist coating processing section to discharge substantially collectively outside the apparatus, and/or an exhaust path that exhausts air from the developing processing mechanisms in the developing processing section to discharge substantially collectively outside the apparatus,
wherein a plurality of exhaust regions to exhaust air is provided in a plurality of resist coating mechanisms in the resist coating processing section and/or a plurality of developing processing mechanisms in the developing processing section, the plurality of exhaust regions is a region of a first enclosing member surrounding the non-processed substrate and a region between the first enclosing member surrounded by a second enclosing member surrounding the first enclosing member and the second enclosing member, and is configured to enable air to be exhausted from the regions mutually independently and/or collectively, and each of the resist coating mechanisms and/or developing processing mechanisms has a support mechanism that supports a backside of the non-processed substrate, a solution intrusion inhibiting mechanism that is provided outside the support mechanism and that inhibits a processing solution from intruding in the direction of a center portion of the backside of the non-processed substrate, and a solution supplying mechanism that supplies the solution to the solution intrusion inhibiting mechanism and/or the backside of the non-processed substrate.

2. The apparatus according to claim 1, wherein gas with adjusted temperature and/or moisture is supplied to a plurality of resist coating mechanisms in the resist coating processing section and/or a plurality of developing processing mechanisms in the developing processing section.

3. The apparatus according to claim 1, wherein a direction of exhaust of the exhaust path is configured to exhaust air substantially from an upper position to a lower position of the apparatus.

4. The apparatus according to claim 1, wherein a resist solution storage is disposed at a lower position of the resist coating processing section, and/or a developing solution storage is disposed at a lower portion of the developing processing section.

5. The apparatus according to claim 1, wherein the exhaust path in the resist coating processing section and the exhaust path in the developing processing section are disposed both on the cassette unit section side, both on the interface unit section side, or on opposite sides.

6. The apparatus according to claim 1, wherein the plurality of exhaust regions is a region of a circular enclosing member surrounding the non-processed substrate and a region between the circular enclosing member surrounded by a rectangular enclosing member surrounding the circular enclosing member and the rectangular enclosing member, and is configured to enable air to be exhausted from the regions mutually independently or collectively.

7. The apparatus according to claim 1, wherein the plurality of exhaust regions is a region of a first enclosing member surrounding the non-processed substrate and a region between the first enclosing member surrounded by a second enclosing member surrounding the first enclosing member and the second enclosing member, and is configured to enable a predetermined processing solution and air to be discharged from the regions.

8. The apparatus according to claim 1, wherein directions of exhaust of both of the exhaust path in the resist coating processing section and the exhaust path in the developing processing section are configured to exhaust air from an upper position to a lower position of the apparatus.

9. The apparatus according to claim 1, wherein discharge of the solution by the solution supplying mechanism is performed in a state where air is exhausted from both the second enclosing member and the first enclosing member, or in a state where air is exhausted from at least the second enclosing member.

10. A substrate processing method comprising:
coating a resist solution on a non-processed substrate to process while holding the non-processed substrate horizontally by adsorption on a chuck configured to be rotatable inside each of a plurality of resist coating processing mechanisms and supplying gas with controlled temperature and/or moisture vertically to the non-processed substrate from above the non-processed substrate; and
supplying a developing solution to the non-processed substrate to process while holding the non-processed substrate horizontally by adsorption on a chuck configured to be rotatable inside each of a plurality of developing processing mechanisms and supplying gas with controlled temperature and/or moisture to the non-processed substrate from above the non-processed substrate,
wherein the method further comprises a solution intrusion inhibiting step of supporting a backside of the non-processed substrate in the resist coating processing and/or the developing processing, and by a solution intrusion inhibiting mechanism, inhibiting a processing solution from intruding in the direction of a center portion of the backside of the non-processed substrate, and
a step of supplying the solution to the backside of the non-processed substrate and/or the solution intrusion inhibiting mechanism before and/or after the solution intrusion inhibiting step.

11. The method according to claim 10, wherein an exhaust region is selected to exhaust air in an area of each of the plurality of resist coating processing mechanisms and/or in an area of each of the developing processing mechanisms.

12. The method according to claim 10, wherein a first enclosing region surrounding the non-processed substrate and a second enclosing region surrounding the first enclosing region are selected to exhaust air in an area of each of the plurality of resist coating processing mechanisms and/or in an area of each of the developing processing mechanisms.

13. The method according to claim 10, wherein an exhaust amount in the first enclosing region is decreased or halted during a period of time a processing solution is supplied to the non-processed substrate and/or the processing solution is processed to react.

14. The method according to claim 10, wherein each of the plurality of resist coating processing mechanisms and/or each of the developing processing mechanisms has in an area of each of the mechanisms a first enclosing region surrounding the non-processed substrate and a second enclosing region surrounding the first enclosing region, and regions are controlled so that air is exhausted from the regions mutually independently and/or collectively.

15. The method according to claim 14, wherein the first enclosing region is a circular region, and the second enclosing region is a rectangular region.

* * * * *